(12) United States Patent
Cho et al.

(10) Patent No.: US 12,433,114 B2
(45) Date of Patent: Sep. 30, 2025

(54) DISPLAY APPARATUS

(71) Applicant: SAMSUNG DISPLAY CO., LTD., Yongin-si (KR)

(72) Inventors: Jaebum Cho, Yongin-si (KR); Seungchan Lee, Yongin-si (KR); Beomsoo Park, Yongin-si (KR); Wangjo Lee, Yongin-si (KR); Jaeik Lim, Yongin-si (KR); Donghee Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 870 days.

(21) Appl. No.: 17/564,622

(22) Filed: Dec. 29, 2021

(65) Prior Publication Data

US 2022/0310763 A1    Sep. 29, 2022

(30) Foreign Application Priority Data

Mar. 26, 2021    (KR) .................... 10-2021-0039778

(51) Int. Cl.
| | |
|---|---|
| H10K 59/131 | (2023.01) |
| G09F 9/30 | (2006.01) |
| H10K 50/86 | (2023.01) |

(52) U.S. Cl.
CPC ........... *H10K 59/131* (2023.02); *G09F 9/301* (2013.01); *H10K 50/865* (2023.02); *H10K 59/1315* (2023.02)

(58) Field of Classification Search
None
See application file for complete search history.

(56) References Cited

U.S. PATENT DOCUMENTS

| | | |
|---|---|---|
| 7,515,406 B2 | 4/2009 | Kee et al. |
| 10,446,635 B2 | 10/2019 | Moon et al. |
| 10,784,316 B2 | 9/2020 | Lee et al. |
| 10,892,312 B2 * | 1/2021 | Won ............... H10K 59/131 |
| 10,901,542 B2 | 1/2021 | Kim et al. |
| 10,937,855 B2 | 3/2021 | Jo et al. |
| 11,444,146 B2 | 9/2022 | Kim et al. |

(Continued)

FOREIGN PATENT DOCUMENTS

| | | |
|---|---|---|
| KR | 101400284 B1 | 5/2014 |
| KR | 101666586 B1 | 10/2016 |

(Continued)

*Primary Examiner* — Alexander G Ghyka
(74) *Attorney, Agent, or Firm* — CANTOR COLBURN LLP

(57) ABSTRACT

A display apparatus includes: a substrate including a display area and a non-display area, where the non-display area includes a first area, a second area, a bent area and a pad area, and the bent area is arranged between the first area and the second area; a display portion arranged in the display area; a driving circuit portion arranged in the non-display area; and a fan-out portion arranged between the display portion and the driving circuit portion and in the first area, the bent area and the second area, where the fan-out portion transfers a data signal from the driving circuit portion to the display portion. The fan-out portion includes a first data line including a first first data line arranged in the second area and a second first data line arranged in the pad area and disposed in a layer different from the first first data line.

14 Claims, 20 Drawing Sheets

(56) References Cited

U.S. PATENT DOCUMENTS

| | | | | |
|---|---|---|---|---|
| 2017/0357115 A1* | 12/2017 | Jeon | ................. | G02F 1/136286 |
| 2019/0280065 A1* | 9/2019 | Kim | .................... | H10K 59/122 |
| 2020/0219453 A1* | 7/2020 | Park | .................... | G09G 3/3291 |
| 2021/0408207 A1* | 12/2021 | Shu | ....................... | H05K 1/189 |
| 2022/0100346 A1* | 3/2022 | Kim | .................... | H10K 59/131 |

FOREIGN PATENT DOCUMENTS

| | | | |
|---|---|---|---|
| KR | 1020180082688 A | | 7/2018 |
| KR | 1020190006618 A | | 1/2019 |
| KR | 1020190090417 A | | 8/2019 |
| KR | 1020200066504 A | | 6/2020 |
| KR | 1020210002287 A | | 1/2021 |

* cited by examiner

DISPLAY APPARATUS

This application claims priority to Korean Patent Application No. 10-2021-0039778, filed on Mar. 26, 2021, and all the benefits accruing therefrom under 35 U.S.C. § 119, the content of which in its entirety is herein incorporated by reference.

BACKGROUND

1. Field

One or more embodiments relate to a display apparatus.

2. Description of the Related Art

Among display apparatuses, an organic light-emitting display apparatus has desired characteristics such as wide viewing angles, high contrast, and fast response speeds, and thus, has been widely used as a next-generation display apparatus in various fields.

Generally, organic light-emitting display apparatuses operate with a thin-film transistor and an organic light-emitting diode provided on a substrate, and the organic light-emitting diode spontaneously emits light. Organic light-emitting display apparatuses are typically used as displays of small-scale or portable products such as mobile phones and also used as displays of large-scale products such as televisions.

Display apparatuses such as organic light-emitting display apparatuses may include a display portion and a fan-out portion, and the display portion may be arranged on a substrate, and the fan-out portion may include a wiring that extends to one side of the display portion. In such display apparatuses, visibility at various angles may be improved or the area of a non-display area may be reduced by bending at least a portion of the display apparatuses.

SUMMARY

One or more embodiments include a display apparatus with reduced non-display area and having an improved light-emission uniformity between adjacent pixels.

According to an embodiment of the invention, a display apparatus includes a substrate including a display area and a non-display area, where the non-display area includes a first area, a second area, a bent area and a pad area, and the bent area is arranged between the first area and the second area, a display portion arranged in the display area, a driving circuit portion arranged in the non-display area, and a fan-out portion arranged between the display portion and the driving circuit portion and in the first area, the bent area and the second area, where the fan-out portion transfers a data signal from the driving circuit portion to the display portion. In such an embodiment, the fan-out portion includes a first data line including a first first data line and a second first data line, the first first data line is arranged in the second area, and the second first data line is arranged in the pad area and disposed in a layer different from the first first data line.

In an embodiment, the first data line may further include a third first data line arranged in the bent area, and the third first data line may be disposed in a layer different from the second first data line.

In an embodiment, the first first data line and the second first data line may include different materials from each other.

In an embodiment, the fan-out portion may further include a second data line including a first second data line and a second second data line, the first second data line may be arranged in the second area, and the second second data line may be arranged in the pad area and disposed in a layer different from the first second data line.

In an embodiment, the first first data line may be disposed in a same layer as the first second data line.

In an embodiment, the second first data line and the second second data line may be disposed in different layers from each other.

In an embodiment, the fan-out portion may further include a first fan-out portion, a second fan-out portion, and a separation area between the first fan-out portion and the second fan-out portion.

In an embodiment, the first first data line may be electrically connected to the second first data line through a first contact hole defined in the second area.

In an embodiment, a position of the first contact hole inside the first fan-out portion may gradually being toward or away from the display portion.

In an embodiment, the first second data line may be electrically connected to the second second data line through a second contact hole defined in the second area.

In an embodiment, in the second data line and the first data line arranged closest to each other with the separation area therebetween, the second contact hole may be closer to the display portion than the first contact hole, the first second data line of the second data line may be electrically connected to the second second data line through the second contact hole, and the first first data line of the first data line may be electrically connected to the second first data line through the first contact hole.

In an embodiment, the display apparatus may be foldable around a folding axis.

According to an embodiment of the invention, a display apparatus includes a substrate including a display area and a non-display area, where the non-display area includes a first area, a second area, a bent area and a pad area, and the bent area is arranged between the first area and the second area, a display portion arranged in the display area, a driving circuit portion arranged in the non-display area, and a fan-out portion arranged between the display portion and the driving circuit portion and in the first area, the bent area and the second area, where the fan-out portion transfers a data signal from the driving circuit portion to the display portion. In such an embodiment, the fan-out portion includes a first data line including a first first data line and a second first data line, the first first data line is arranged in the second area and includes a first portion and a second portion, which are disposed in different layers from each other, and the second first data line is arranged in the pad area and disposed in a same layer as the first portion or the second portion.

In an embodiment, a same signal may be applied to the first portion and the second portion.

In an embodiment, the first portion may overlap at least a portion of the second portion.

In an embodiment, the second first data line may have a first width, and the first portion may have a second width greater than the first width.

In an embodiment, the fan-out portion may include a second data line, and the second data line includes a first second data line and a second second data line, the first second data line may be arranged in the second area, and the second second data line may be arranged in the pad area and disposed in a layer different from the first second data line.

In an embodiment, the second second data line may be disposed in a same layer as the first portion or the second portion.

In an embodiment, the first second data line may overlap at least a portion of the first portion.

In an embodiment, the display apparatus may further include a shield layer arranged between the first first data line and the first second data line.

According to an embodiment, a display apparatus foldable around a folding axis includes a substrate including a display area and a non-display area, where the non-display area includes a first area, a second area, a bent area and a pad area, and the bent area is arranged between the first area and the second area, a display portion arranged in the display area, a driving circuit portion arranged in the non-display area, and a fan-out portion arranged between the display portion and the driving circuit portion and in the first area, the bent area and the second area, where the fan-out portion transfers a data signal from the driving circuit portion to the display portion. In such an embodiment, the fan-out portion includes a first data line including a first first data line and a second first data line, which are disposed in different layers from each other.

In an embodiment, the first first data line may be arranged in the second area, and the second first data line may be arranged in the pad area.

BRIEF DESCRIPTION OF THE DRAWINGS

The above and other features of certain embodiments of the disclosure will be more apparent from the following description taken in conjunction with the accompanying drawings, in which.

DETAILED DESCRIPTION

Figure 1:
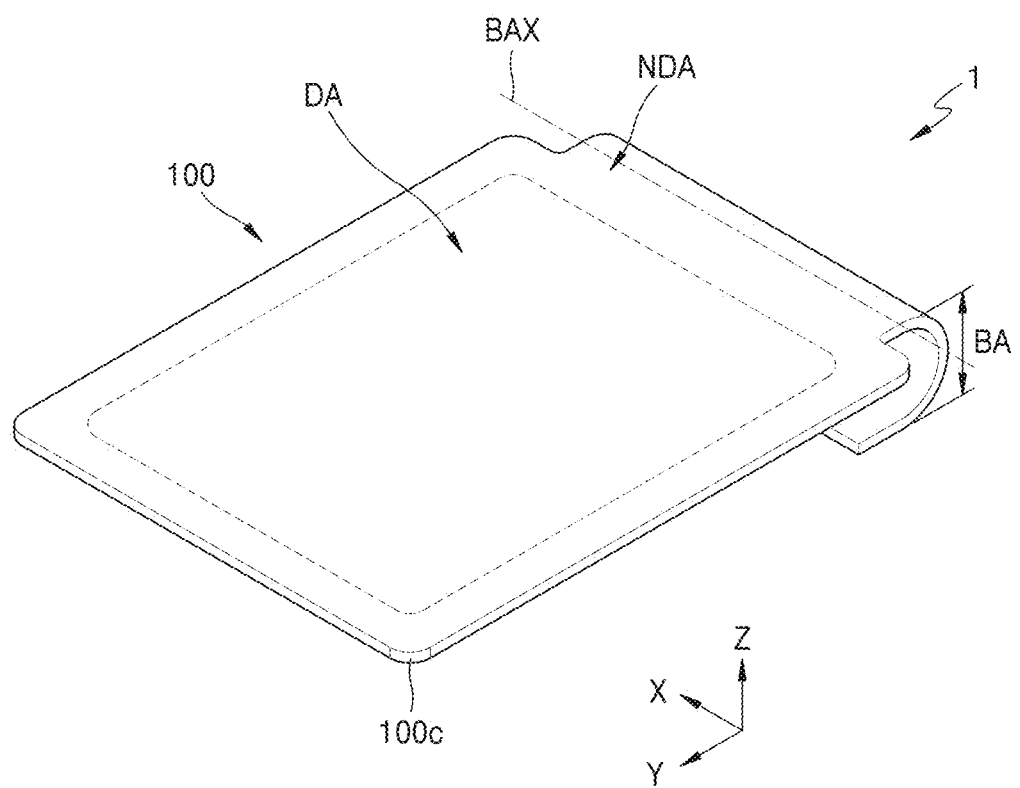
FIG. 1 is a perspective view of a display apparatus according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Sizes of elements in the drawings may be exaggerated or reduced for convenience of explanation. For example, since sizes and thicknesses of elements in the drawings are arbitrarily illustrated for convenience of description, the disclosure is not limited thereto.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

As used herein, when a wiring is referred to as "extending in a first direction or a second direction", it means that the wiring not only extends in a straight line shape but also extends in a zigzag or in a curve in the first direction or the second direction.

As used herein, "on a plan view" means that an objective portion is viewed from above, and "on a cross-sectional view" means that a cross-section of an objective portion taken vertically is viewed from a lateral side. As used herein, "overlapping" includes overlapping "in a plan view" and "in a cross-sectional view."

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2A:
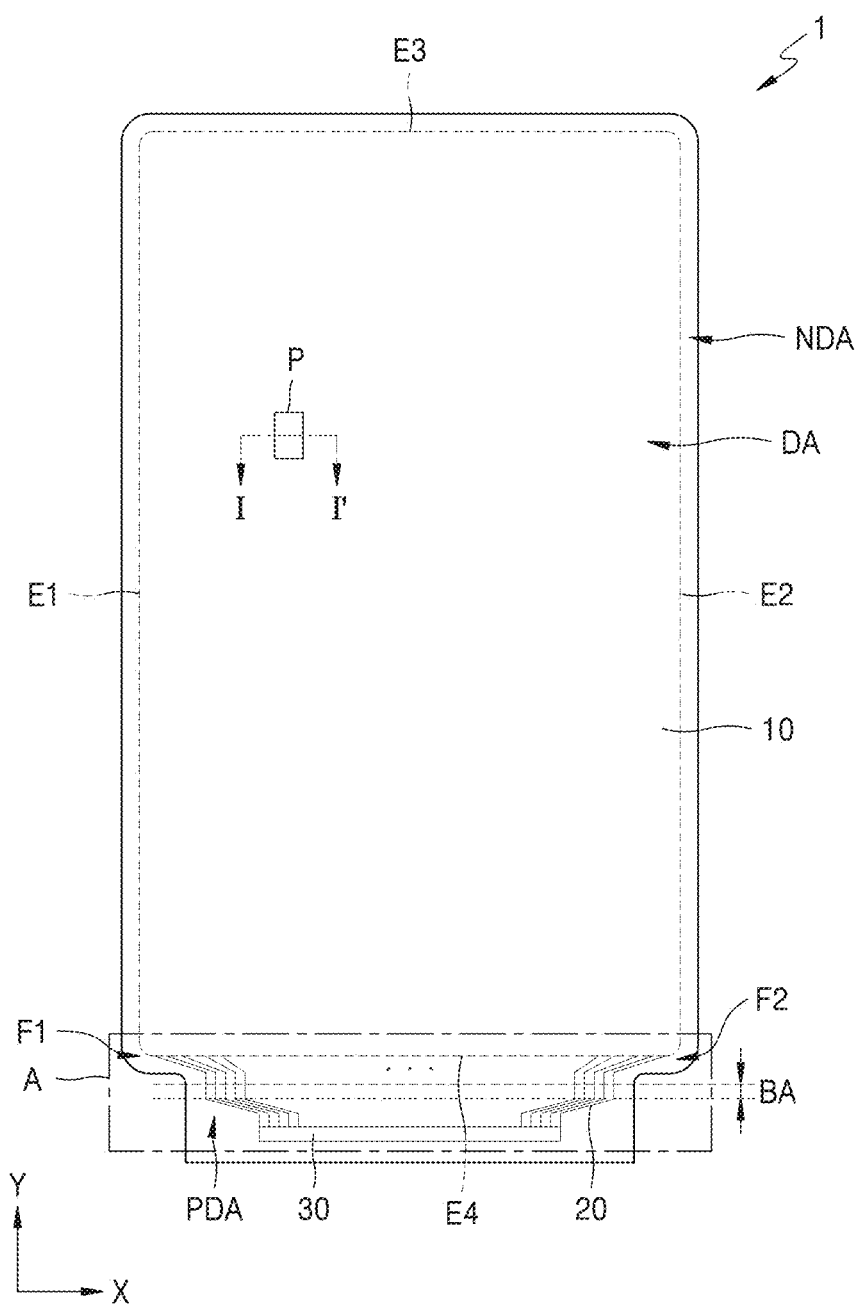
FIGS. 2A and 2B are plan views of a display apparatus according to an embodiment.
Figure 2B:
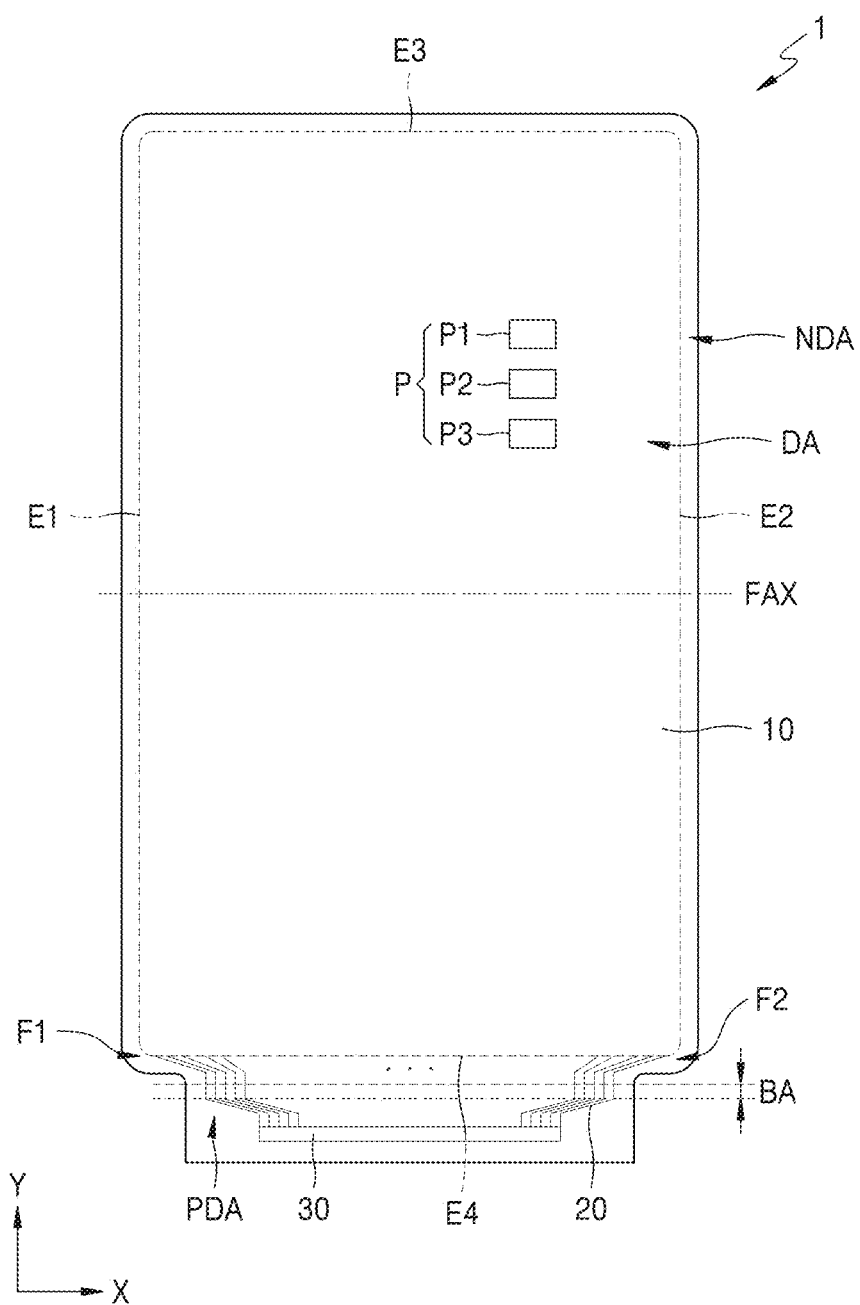

FIG. 1 is a perspective view of a display apparatus 1 according to an embodiment, and FIGS. 2A and 2B are plan views of the display apparatus 1 according to an embodiment.

Referring to FIG. 1, an embodiment of the display apparatus 1 may include a display area DA and a non-display area NDA outside the display area DA. The non-display area NDA may include a bent area BA formed or defined by bending a portion of the non-display area NDA. The rest of area except for the bent area BA may be substantially flat or an area having an approximately flat surface. The bent area BA may be bent around a bending axis BAX extending in a first direction (an X-direction) as shown in FIG. 1. Here, a display surface of the display apparatus 1 may be on a plane defined by the first direction and a second direction (a Y-direction) crossing the first direction, and a third direction (a Z-direction) may be a direction perpendicular to the first and second directions or a thickness direction of the display apparatus 1.

A substrate 100 may include at least one selected from various flexible, bendable, or rollable materials. In one embodiment, for example, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

In an embodiment, the substrate 100 may have a multi-layered structure including two layers, each including at least one selected from the above polymer resins, and a barrier layer therebetween. In such an embodiment, the barrier layer may include an inorganic material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO), for example. However, various modifications may be made. In an alternative embodiment, where the substrate 100 includes no bent area, the substrate 100 may include glass.

In the substrate 100, the width of the non-display area NDA including the bent area BA in the first direction (the X-direction) may be less than the width of a portion in which the display area DA is arranged in the first direction (the X-direction). In such an embodiment, a corner portion 100c of the edge of the substrate 100 may have a round shape. In such an embodiment, the display area DA may have substantially the same shape as the substrate 100 as shown in FIG. 2A.

Referring to FIG. 2A, the display apparatus 1 may include the display area DA and the non-display area NDA outside the display area DA, and a plurality of pixels P may be arranged in the display area DA. Accordingly, the substrate 100 of the display apparatus 1 may include the display area DA and the non-display area NDA. The non-display area NDA may include a pad area PDA on one side of the display area DA. The pad area PDA is a region to which various kinds of electronic elements such as an integrated circuit IC or a printed circuit board, etc. are electrically attached.

FIG. 2A may a plan view showing the substrate 100, etc. during a manufacturing process. In an electronic apparatus including a final display apparatus or smartphones including a display apparatus, a portion of the substrate 100, etc. may be bent to reduce the area of the non-display area NDA recognized by users. In one embodiment, for example, as shown in FIGS. 1 and 2A, the substrate 100 may include portions in which widths thereof in the first direction (the X-direction) are different, and a portion of the substrate 100 that has a narrower width may be bent around the bending axis BAX parallel to the first direction (the X-direction).

In such an embodiment, at least a portion of the pad area PDA may overlap a portion of the display area DA. In such an embodiment, the bending direction may be set in a way such that the pad area PDA does not hide the display area DA but is arranged behind the display area DA. Accordingly, a user may recognize that the display area DA occupies most of the display apparatus 1.

The edge of the display apparatus 1 may have a shape similar to a rectangle or a square as a whole. In an embodiment, the display area DA may include a first edge E1, a second edge E2, a third edge E3, and a fourth edge E4. In such an embodiment, the first edge E1 and the second edge E2 may face each other, and the third edge E3 and the fourth edge E4 may be arranged between the first edge E1 and the second edge E2 and facing each other. The pad area PDA may be adjacent to the fourth edge E4 among the first to fourth edges E1, E2, E3, and E4. In such an embodiment, a first portion F1 connecting the first edge E1 to the fourth edge E4 may have a round shape. A second portion F2 of the display area DA connecting the second edge E2 to the fourth edge E4 may also have a round shape. In such an embodiment, the display area DA may have a round shape in other portions of the edges.

A display portion 10 including a plurality of pixels P may be arranged in the display area DA. A fan-out portion 20 including a plurality of data lines may be arranged in the pad area PDA. One side of the fan-out portion 20 may be connected to the display portion 10, and another side of the fan-out portion 20 may be connected to a driving circuit portion 30. The driving circuit portion 30 may include various electronic elements such as an integrated circuit IC.

A scan driving circuit may be further arranged on the left and/or the right of the display area DA. The scan driving circuit may be configured to provide a scan signal to each pixel P through a scan line and to provide an emission control signal to each pixel through an emission control line.

Referring to FIG. 2B, an embodiment of the display apparatus 1 may be folded around (with respect to) the folding axis FAX. In an embodiment, the display apparatus 1 may be folded around (with respect to) the folding axis FAX parallel to the first direction (the X-direction). In such an embodiment where the display apparatus 1 is folded around (with respect to) the folding axis FAX parallel to the first direction (the X-direction), a portion of the display area DA above the folding axis FAX may face a portion of the display area DA below the folding axis FAX. In an embodiment, the folding axis FAX may cross at least a portion of the display area DA.

In an embodiment, as shown in FIG. 2B, the display apparatus 1 may be folded around (with respect to) the folding axis FAX parallel to the first direction (the X-direction), but the embodiment is not limited thereto. In an alternative embodiment, the display apparatus 1 may be folded around (with respect to) the folding axis FAX parallel to the second direction (the Y-direction) crossing the first direction (the X-direction).

In an embodiment, the display apparatus 1 may include the display portion 10 arranged in the display area DA. In an embodiment, the display portion 10 may include a plurality of pixels P.

In an embodiment, the pixels P may include a first pixel P1, a second pixel P2, and a third pixel P3. In an embodiment, the first pixel P1, the second pixel P2, and the third pixel P3 may respectively emit red, green, and blue component of light. However, the embodiment is not limited thereto.

In an embodiment, the first pixel P1, the second pixel P2, and/or the third pixel P3 may be provided in a landscape configuration in which a length in a horizontal direction (e.g., the first direction (the X-direction)) is longer than a length in a vertical direction (e.g., the second direction (the Y-direction)). In an embodiment, the first pixel P1, the second pixel P2, and/or the third pixel P3 may be provided in a portrait configuration in which a length in the vertical direction (e.g., the second direction (the Y-direction)) is longer than a length in the horizontal direction (e.g., the first direction (the X-direction)).

In an alternative embodiment, the first pixel P1, the second pixel P2, and/or the third pixel P3 may be arranged in one of other various configurations such as a pentile structure, a stripe structure, a mosaic configuration structure, and a delta configuration structure.

Figure 3:
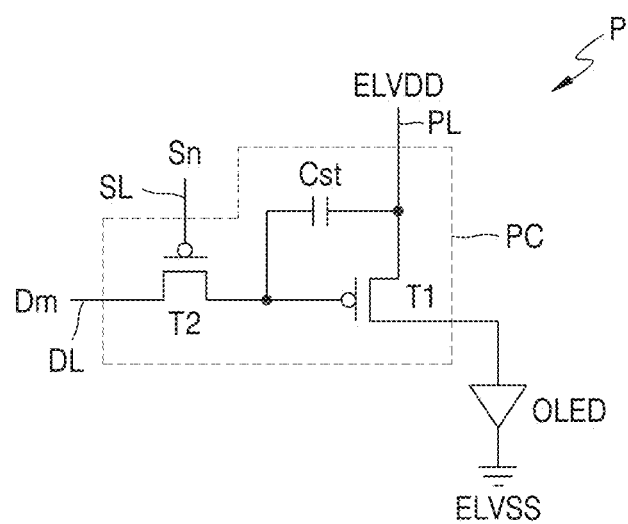
FIGS. 3 and 4 are equivalent circuit diagrams of a pixel of a display apparatus according to an embodiment.
Figure 4:
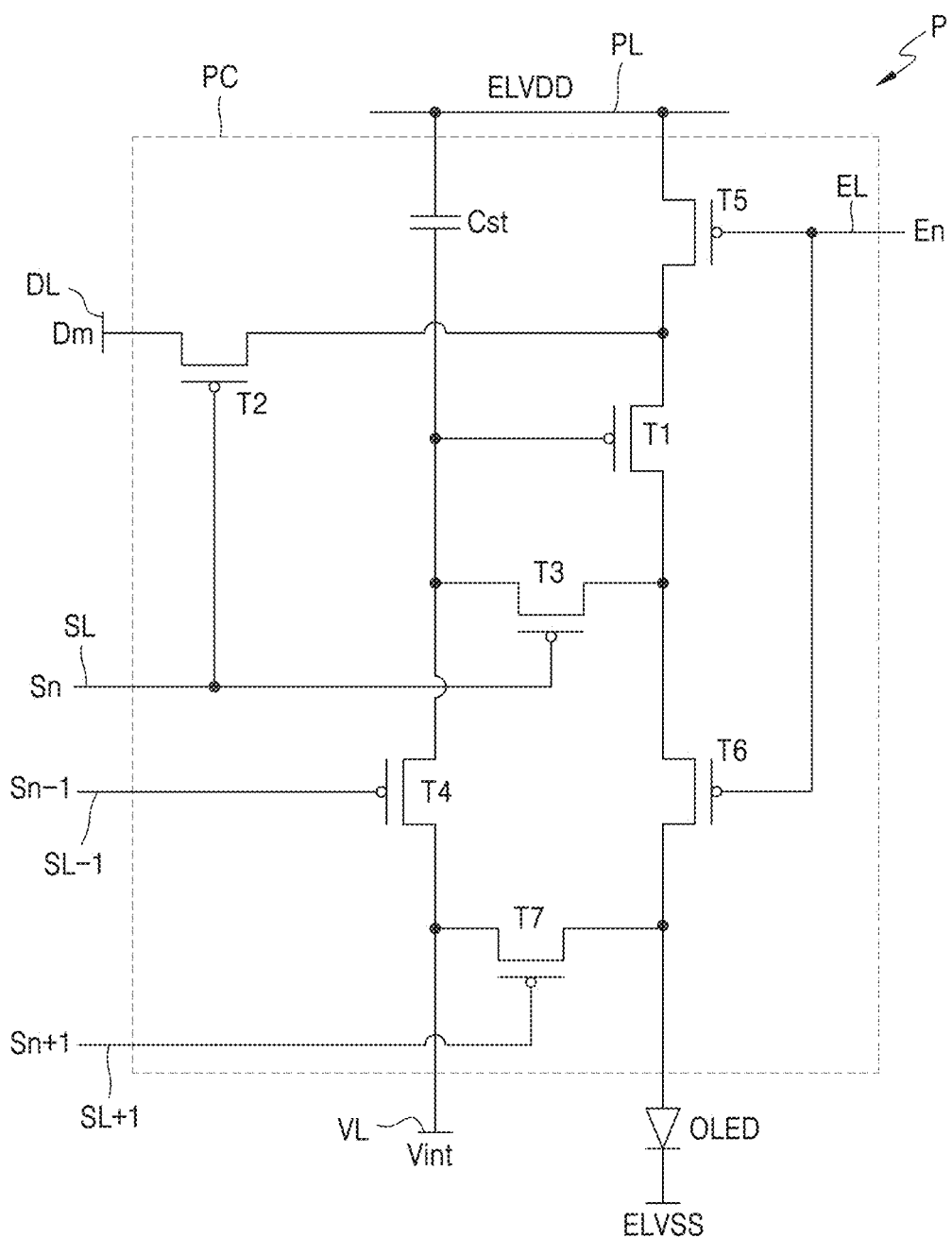

FIGS. 3 and 4 are equivalent circuit diagrams of a pixel of the display apparatus 1 according to an embodiment.

Referring to FIG. 3, in an embodiment, the pixel circuit PC may be connected to an organic light-emitting diode OLED to implement light emission of the pixels P. The pixel circuit PC may include a driving thin-film transistor T1, a switching thin-film transistor T2, and a storage capacitor Cst. The switching thin-film transistor T2 may be connected to a scan line SL and a data line DL and configured to transfer a data signal Dm to the driving thin-film transistor T1 in response to a scan signal Sn input through the scan line SL, and the data signal Dm may be input through the data line DL.

The storage capacitor Cst may be connected to the switching thin-film transistor T2 and a driving voltage line PL and configured to store a voltage corresponding to a difference between a voltage transferred from the switching thin-film transistor T2 and a driving voltage ELVDD supplied to the driving voltage line PL.

The driving thin-film transistor T1 may be connected to the driving voltage line PL and the storage capacitor Cst and be configured to control a driving current flowing from the driving voltage line PL to the organic light-emitting diode OLED based on the voltage stored in the storage capacitor Cst. The organic light-emitting diode OLED may be configured to emit light having a preset brightness based on the driving current.

In an embodiment, as shown in FIG. 3, a pixel circuit PC includes two thin-film transistors and a single storage capacitor, but the embodiment is not limited thereto.

Referring to FIG. 4, in an alternative embodiment, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, a second initialization thin-film transistor T7, and the storage capacitor Cst.

In an embodiment, as shown in FIG. 4 that each pixel circuit PC includes signal lines, that is, the scan line SL, a previous scan line SL−1, a next scan line SL+1, an emission control line EL, and a data line DL, an initialization voltage line VL, and the driving voltage line PL, but the embodiment is not limited thereto. In an alternative embodiment, at least one of the signal lines, that is, the scan line SL, a previous scan line SL−1, a next scan line SL+1, an emission control line EL, and a data line DL, and/or the initialization voltage line VL may be shared by pixel circuits that are adjacent to each other.

A drain electrode of the driving thin-film transistor T1 may be electrically connected to the organic light-emitting diode OLED through the emission control thin-film transistor T6. The driving thin-film transistor T1 may receive a data signal Dm in response to a switching operation of the switching thin-film transistor T2 to supply the driving current to the organic light-emitting diode OLED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the driving thin-film transistor T1 and connected to the driving voltage line PL through the operation control thin-film transistor T5.

The switching thin-film transistor T2 may be turned on in response to a scan signal Sn transferred through the scan line SL to perform the switching operation of transferring a data signal Dm to the source electrode of the driving thin-film transistor T1, and the data signal Dm may be transferred through the data line DL.

A gate electrode of the compensation thin-film transistor T3 may be connected to the scan line SL. A source electrode of the compensation thin-film transistor T3 may be connected to the drain electrode of the driving thin-film transistor T1 and connected to a pixel electrode of the organic light-emitting diode OLED through the emission control thin-film transistor T6. A drain electrode of the compensation thin-film transistor T3 may be connected to one of electrodes of the storage capacitor Cst, a source electrode of the first initialization thin-film transistor T4, and a gate electrode of the driving thin-film transistor T1, simultaneously. The compensation thin-film transistor T3 may be turned on in response to a scan signal Sn transferred through the scan line SL to diode-connect the driving thin-film transistor T1 by connecting the gate electrode to the drain electrode of the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be connected to one of the electrodes of the storage capacitor Cst, the drain electrode of the compensation thin-film transistor T3, and the gate electrode of the driving thin-film transistor T1, simultaneously. The first initialization thin-film transistor T4 may be turned on in response to a previous scan signal Sn−1 transferred through the previous scan line SL−1 to perform an initialization operation of initializing the voltage of the gate electrode of the driving thin-film transistor T1 by transferring an initialization voltage Vint to the gate electrode of the driving thin-film transistor T1.

The gate electrode of the operation control thin-film transistor T5 may be connected to an emission control line EL. A source electrode of the operation control thin-film transistor T5 may be connected to the driving voltage line PL. A drain electrode of the operation control thin-film transistor T5 may be connected to the source electrode of the driving thin-film transistor T1, and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1, and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 are simultaneously turned on in response to an emission control signal En transferred through the emission control line EL, the driving voltage ELVDD is transferred to the organic light-emitting diode OLED, and the driving current flows through the organic light-emitting diode OLED.

A gate electrode of the second initialization thin-film transistor T7 may be connected to the next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 transferred through the next scan line SL+1 to initialize the pixel electrode of the organic light-emitting diode OLED.

In an embodiment, as shown in FIG. 4, the first initialization thin-film transistor T4 and the second initialization thin-film transistor T7 are respectively connected to the previous scan line SL−1 and the next scan line SL+1, but the embodiment is not limited thereto. In an alternative embodiment, both the first initialization thin-film transistor T4 and the second initialization thin-film transistor T7 may be connected to the previous scan line SLn−1, and thus, driven according to a previous scan signal Sn−1.

The other electrode of the storage capacitor Cst may be connected to the driving voltage line PL. One of the electrodes of the storage capacitor Cst may be connected to the gate electrode of the driving thin-film transistor T1, the drain electrode of the compensation thin-film transistor T3, and the source electrode of the first initialization thin-film transistor T4, simultaneously.

An opposite electrode (e.g., a cathode) of the organic light-emitting diode OLED may receive a common voltage ELVSS. The organic light-emitting diode OLED may emit light by receiving the driving current from the driving thin-film transistor T1.

The number of thin-film transistors, the number of storage capacitors, and the circuit design of the pixel circuit PC is not limited to those described with reference to FIG. 4, but the number of thin-film transistors, the number of storage capacitors, and the circuit design may be variously changed or modified.

Figure 5:
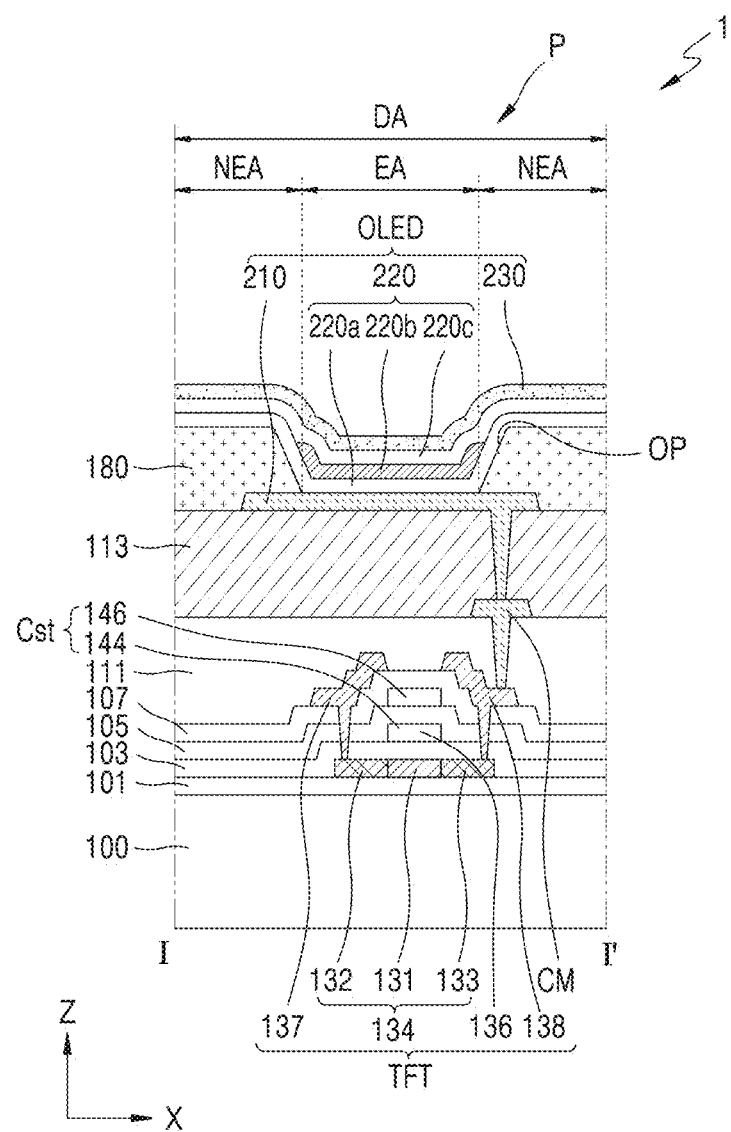
FIG. 5 is a cross-sectional view of a display apparatus according to an embodiment.

FIG. 5 is a cross-sectional view of the display apparatus 1 according to an embodiment. FIG. 5 corresponds to a cross-sectional view of the display apparatus 1, taken along line I-I' of FIG. 2A.

Referring to FIG. 5, the thin-film transistor TFT and the organic light-emitting diode OLED may be disposed or arranged over the substrate 100.

A buffer layer 101 may be disposed or arranged on the substrate 100. The buffer layer 101 may be disposed or arranged on the substrate 100 and configured to reduce or block the penetration of foreign substance, moisture, or external air from below the substrate 100 and provide a flat surface on the substrate 100. The buffer layer 101 may include an inorganic material such as an oxide or a nitride, an organic material, or an organic/inorganic composite material and may have a single-layered structure or a multi-layered structure including an inorganic material and an organic material.

In an embodiment, the buffer layer 101 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). Alternatively, the buffer layer 101 may include an organic insulating material such as polyimide and siloxane.

In an embodiment, the buffer layer 101 may have a thickness in a range from about 50 nanometers (nm) to about 10 μm.

The thin-film transistor TFT may be disposed or arranged on the buffer layer 101. The thin-film transistor TFT may include a semiconductor layer 134, a gate electrode 136, and a connection electrode, the gate electrode 136 overlapping the semiconductor layer 134, and the connection electrode being electrically connected to the semiconductor layer 134. The thin-film transistor TFT may be connected to the organic light-emitting diode OLED to drive the organic light-emitting diode OLED.

The semiconductor layer 134 may be disposed or arranged on the buffer layer 101 and may include a channel region 131, a source region 132, and a drain region 133, the channel region 131 overlapping the gate electrode 136, and the source region 132 and the drain region 133, which are at two opposite sides of the channel region 131 and including high-concentration impurities. Here, the impurities may include N-type impurities or P-type impurities. The source region 132 and the drain region 133 may be electrically connected to the connection electrode.

The semiconductor layer 134 may include an oxide semiconductor and/or a silicon semiconductor. In an embodiment where the semiconductor layer 134 includes an oxide semiconductor, the semiconductor layer 134 may include an oxide of at least one selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). In one embodiment, for example, the semiconductor layer 134 may include In—Sn—Zn—O ("ITZO"), or In—Ga—Zn—O ("IGZO"). In an embodiment where the semiconductor layer 134 includes a silicon semiconductor, the semiconductor layer 134 may include, for example, amorphous silicon ("a-Si") or low-temperature polycrystalline silicon ("LTPS") that is obtained by crystallizing amorphous silicon.

A first insulating layer 103 may be disposed or arranged on the semiconductor layer 134. The first insulating layer 103 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The first insulating layer 103 may include a single layer or a multi-layer including the inorganic insulating material.

The gate electrode 136 may be disposed or arranged on the first insulating layer 103. The gate electrode 136 may include a single layer or a multi-layer including at least one metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line configured to apply an electric signal to the gate electrode 136.

In an embodiment, the thickness of the gate electrode 136 may be about 50 nm or more.

A second insulating layer 105 may be disposed or arranged on the gate electrode 136. The second insulating layer 105 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The second insulating layer 105 may include a single layer or a multi-layer including the above inorganic insulating materials.

The storage capacitor Cst may be disposed or arranged on the first insulating layer 103. The storage capacitor Cst may include a lower electrode 144 and an upper electrode 146 overlapping the lower electrode 144. The lower electrode 144 of the storage capacitor Cst may overlap the upper electrode 146 with the second insulating layer 105 therebetween.

The lower electrode 144 of the storage capacitor Cst may overlap the gate electrode 136 of the thin-film transistor TFT and be integrally formed as a single unitary unit with the gate electrode 136 of the thin-film transistor TFT. In an embodiment, the lower electrode 144 of the storage capacitor Cst may not overlap the thin-film transistor TFT and be a separate element independent of the gate electrode 136 of the thin-film transistor TFT.

The upper electrode 146 of the storage capacitor Cst may include aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and/or copper (Cu) and include a single layer or a multi-layer including at least one selected from the above materials.

In an embodiment, the thickness of the upper electrode 146 may be about 50 nm or more.

A third insulating layer 107 may be disposed or arranged on the upper electrode 146 of the storage capacitor Cst. The third insulating layer 107 may include at least one inorganic insulating material selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide (ZnO). The third insulating layer 107 may include a single layer or a multi-layer including at least one selected from the above inorganic insulating materials.

A source electrode 137 and a drain electrode 138, which are connection electrodes, may be disposed or arranged on the third insulating layer 107. The source electrode 137 and the drain electrode 138 may include a conductive material including at least one selected from molybdenum (Mo), aluminum (Al), copper (Cu), and titanium (Ti) and have a single-layered structure or a multi-layered structure including least one selected from the above materials. The source electrode 137 and the drain electrode 138 may include a multi-layered structure of Ti/Al/Ti.

A first planarization layer 111 may be disposed or arranged on the source electrode 137 and the drain electrode 138. The first planarization layer 111 may be a single layer or a multi-layer including an organic material or an inorganic material. In an embodiment, the first planarization layer 111 may include a general-purpose polymer such as benzocyclobutene ("BCB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an embodiment, the first planarization layer 111 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). After the first planarization layer 111 is formed, chemical and mechanical polishing may be performed thereon to provide a flat top surface.

A contact metal layer CM may be disposed or arranged on the first planarization layer 111. The contact metal layer CM may include at least one selected from aluminum (Al), copper (Cu), and titanium (Ti), and be a single layer or a multi-layer. The contact metal layer CM may have a multi-layered structure of Ti/Al/Ti.

A second planarization layer 113 may be disposed or arranged on the contact metal layer CM. In an embodiment, the second planarization layer 113 and the first planarization layer 111 may include a same material as each other. In an embodiment, the second planarization layer 113 may include a material different from that of the first planarization layer 111.

An organic light-emitting diode OLED may be disposed or arranged on the second planarization layer 113, and the organic light-emitting diode OLED may include a pixel electrode 210, an intermediate layer 220, and an opposite electrode 230. The pixel electrode 210 may be electrically connected to the contact metal layer CM through a contact hole defined through the second planarization layer 113, the contact metal layer CM may be electrically connected to the source electrode 137 or the drain electrode 138, which are connection electrodes of the thin-film transistor TFT, through a contact hole defined through the first planarization layer 111. Accordingly, the organic light-emitting diode OLED may be electrically connected to the thin-film transistor TFT.

The pixel electrode 210 may be disposed or arranged on the second planarization layer 113. The pixel electrode 210 may be a (semi) transparent electrode or a reflective electrode. In an embodiment where the pixel electrode 210 includes a reflective layer and a transparent or semi-transparent electrode layer on the reflective layer, the reflective layer may include at least one selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), copper (Cu), and a compound thereof. The transparent or semi-transparent electrode layer may include at least one selected from indium tin oxide ("ITO"), indium zinc oxide ("IZO"), zinc oxide (ZnO), indium oxide ($In_2O_3$), indium gallium oxide ("IGO"), and aluminum zinc oxide ("AZO"). The pixel electrode 210 may have a stack structure of ITO/Ag/ITO.

A pixel-defining layer 180 may be disposed or arranged on the second planarization layer 113 and an opening OP that exposes at least a portion of the pixel electrode 210 may be defined therethrough. A region exposed by the opening OP of the pixel-defining layer 180 may be defined as an emission area EA. Surroundings of the emission areas EA are non-emission areas NEA. The non-emission areas NEA may surround the emission areas EA. In an embodiment, the display area DA may include a plurality of emission areas EA and the non-emission areas NEA surrounding the emission areas EA. The pixel-defining layer 180 may prevent an arc, etc. from occurring at the edges of the pixel electrode 210 by increasing a distance between the edges of the pixel electrode 210 and the opposite electrode 230 over the pixel electrode 210. The pixel-defining layer 180 may include an organic insulating material such as polyimide, polyamide, an acrylic resin, BCB, and HMDSO and be formed through methods such as spin coating, etc.

The intermediate layer 220 may be disposed or arranged on at least a portion of the pixel electrode 210 that is exposed through the pixel-defining layer 180. The intermediate layer 220 may include an emission layer 220b. A first functional layer 220a and/or a second functional layer 220c may be selectively provided or arranged under and on the emission layer 220b.

In an embodiment, the intermediate layer 220 may be disposed or arranged on at least a portion of the pixel electrode 210 that is exposed by the pixel-defining layer 180. In an embodiment, the emission layer 220b of the intermediate layer 220 may be disposed or arranged on at least a portion of the pixel electrode 210 that is exposed by the pixel-defining layer 180.

The first functional layer 220a may include a hole injection layer ("HIL") and/or a hole transport layer ("HTL"). The second functional layer 220c may include an electron transport layer ("ETL") and/or an electron injection layer ("EIL").

The emission layer 220b may include an organic material including a fluorescent or phosphorous material that emits red, green, blue, or white light. The emission layer 220b may include a low-molecular weight organic material or a polymer organic material.

In an embodiment where the emission layer 220b includes a low-molecular weight material, the intermediate layer 220 may have a structure in which a hole injection layer, a hole transport layer, an emission layer, an electron transport layer, an electron injection layer, etc. are stacked in a single or composite configuration. The emission layer 220b may include, as the low-molecular weight material, various organic materials such as copper phthalocyanine ("CuPc"), N,N'-Di (naphthalene-1-yl)-N,N'-diphenyl-benzidine ("NPB"), and tris-8-hydroxyquinoline aluminum ("Alq3"). Such layers may be formed by a vacuum deposition method.

In an embodiment where the emission layer 220b includes the polymer organic material, the intermediate layer 220 may have a structure including an HTL and the emission layer 220b. In such an embodiment, the HTL may include poly (3,4-ethylenedioxythiophene) ("PEDOT"), and the emission layer 220b may include a polymer material such as a polyphenylene vinylene ("PPV")-based material and a polyfluorene-based material. The emission layer 220b may be formed through screen printing, an inkjet printing method, or a laser induced thermal imaging ("LITI").

The opposite electrode 230 may be disposed or arranged on the intermediate layer 220. The opposite electrode 230 may be disposed or arranged on the intermediate layer 220 to cover the intermediate layer 200 entirely. The opposite electrode 230 may be disposed or arranged in the display area DA to cover the display area DA entirely. In such an embodiment, the opposite electrode 230 may be integrally formed as a single unitary body over a display panel by using an open mask to cover the plurality of pixels P arranged in the display area DA.

The opposite electrode 230 may include a conductive material having a small work function. In one embodiment, for example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may further include a layer including a material such as ITO, IZO, ZnO, or $In_2O_3$ on the (semi) transparent layer including at least one selected from the above material.

Figure 6:
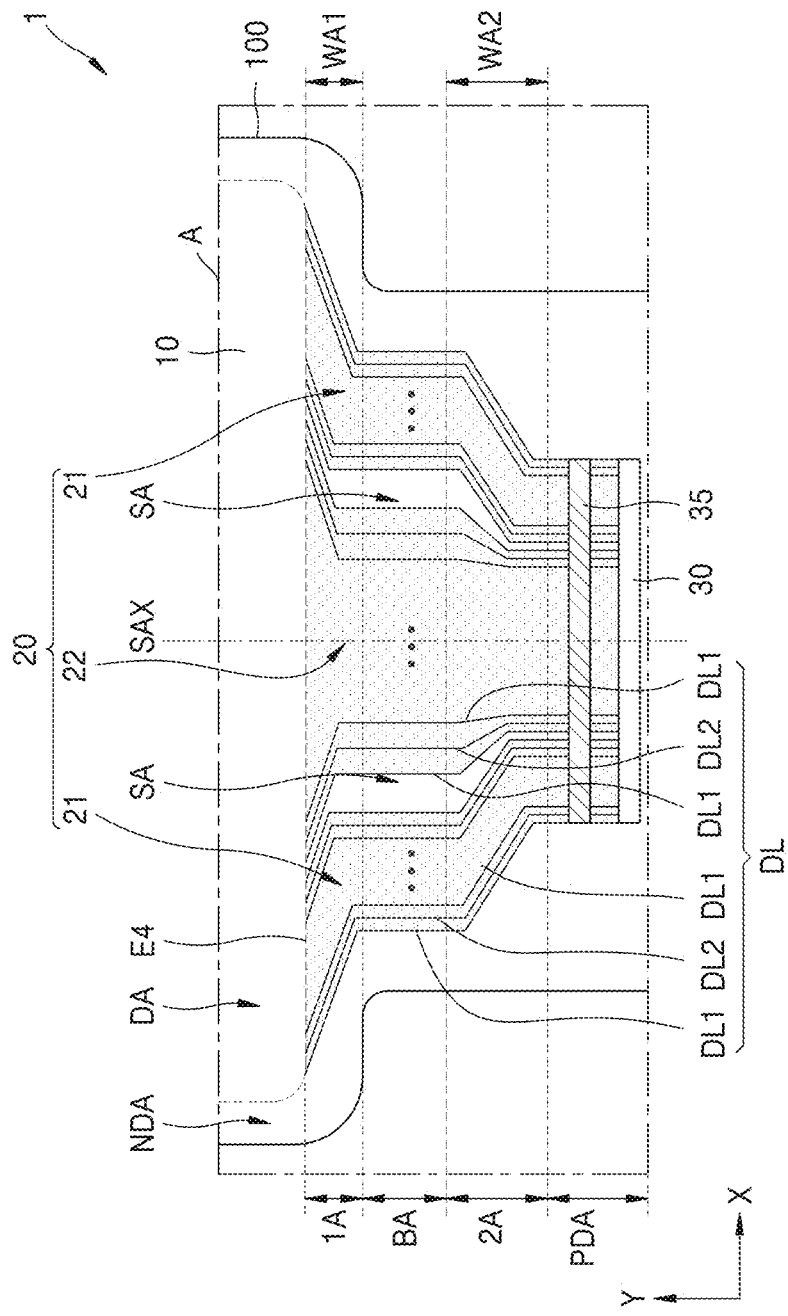
FIG. 6 is a plan view of a display apparatus according to an embodiment.

FIG. 6 is a plan view of the display apparatus 1 according to an embodiment. Specifically, FIG. 6 is an enlarged plan view of a region A of FIG. 2A.

Referring to FIG. 6, in an embodiment, the non-display area NDA may include a first area 1A, a bent area BA, a second area 2A, and a pad area PDA. The first area 1A may be most adjacent or connected to the display area DA. In one embodiment, for example, the first area 1A may be arranged between the fourth edge E4 and the bent area BA. The bent area BA may be arranged between the first area 1A and the second area 2A. The first area 1A and the second area 2A may be defined around the bent area BA. The second area 2A is not viewed from the front when the bent area BA is bent and may be an area between the bent area BA and the pad area PDA. The pad area PDA may be an area in which the driving circuit portion 30 and other circuits are arranged.

In an embodiment, as described above, like the non-display areas NDA contacting the first edge E1 to the third edge E3 of the display area DA as shown in FIG. 2A, the first area 1A may be a region recognized by a user in electronic apparatuses such as a final display apparatus 1 or smartphones including the display apparatus 1. Because the fan-out portion 20 is arranged in the first area 1A, it may not be easy to reduce the width of the first area 1A compared to other non-display areas (that is, the non-display areas NDA contacting the first edge E1 to the third edge E3 of the display area DA).

In an embodiment of the display apparatus 1 according to the invention, a width WA1 of the first area 1A may be reduced by dividing the fan-out portion 20 into a "plurality of sections". It may be understood that the "plurality of sections" respectively correspond to a first fan-out portion 21 and a second fan-out portion 22 of the fan-out portion 20. Accordingly, in an embodiment, the width WA1 of the first area 1A may be less than a width WA1 of the second area 2A. However, the embodiment is not limited thereto. Alternatively, the width WA1 of the first area 1A may be equal or greater than the width WA2 of the second area 2A.

In an embodiment, the fan-out portion 20 may include the first fan-out portion 21 and the second fan-out portion 22. In an embodiment, the first fan-out portions 21 may be arranged on two opposite side portions of the first area 1A with the second fan-out portion 22 therebetween. In an embodiment, the fan-out portion 20 may be provided in a symmetrical shape as a whole. The first fan-out portions 21 may be symmetrically arranged with the second fan-out portion 22 therebetween. The second fan-out portion 22 may be provided in a symmetric shape around a symmetric axis SAX. The first fan-out portions 21 may be respectively disposed or arranged on one side and the other side with the second fan-out portion 22 therebetween. In one embodiment, for example, the first fan-out portion 21 may be arranged outside the second fan-out portion 22. In an embodiment, the first fan-out portion 21 may be separated from the second fan-out portion 22 by a separation area SA.

In an embodiment, as shown in FIG. 6, the fan-out portion 20 is divided into three regions, but the embodiment is not limited thereto. In an alternative embodiment, the fan-out portion 20 may be divided into various numbers of areas such as four, five, and six. In one embodiment, for example, the fan-out portion 20 may be divided into five areas with separation areas SA therebetween.

Hereinafter, for convenience of description, the first fan-out portion 21 arranged on the left of the second fan-out portion 22 will be mainly described.

In an embodiment, a plurality of data lines DL may be arranged on each of the first fan-out portion 21 and the second fan-out portion 22. In an embodiment, the plurality of data lines DL may include a plurality of first data lines DL1 and a plurality of second data lines DL2. In an embodiment, the plurality of first data lines DL1 and the plurality of second data lines DL2 may be arranged on each of the first fan-out portion 21 and the second fan-out portion 22. The plurality of first data lines DL1 and the plurality of second data lines DL2 may be configured to transfer data signals to the display portion 10, and the data signals may be applied thereto from the driving circuit portion 30. In an embodiment, the plurality of first data lines DL1 and the plurality of second data lines DL2 may be alternately (in turns) arranged with each other. In one embodiment, for example, one second data line DL2 may be arranged between two adjacent first data lines DL1.

In an embodiment, a first data line DL1 may be arranged on the leftmost side (the start portion) of the first fan-out portion 21, a second data line DL2 may be arranged apart in the first direction (the X-direction) from the first data line DL1, and another first data line DL1 may be arranged again apart in the first direction (the X-direction) from the second data line DL2. In such an embodiment, the first data line DL1, the second data line DL2, the another first data line DL1, and another second data line DL2 may be sequentially arranged. The first data line DL1 and the second data line DL2 may be sequentially arranged, and the second data line DL2 may be arranged on the rightmost side (the end portion) of the first fan-out portion 21. In an embodiment, the first data line DL1 may be arranged on the leftmost side (the start portion) of the second fan-out portion 22, the second data line DL2 may be arranged apart in the first direction (the X-direction) from the first data line DL1, and the first data line DL1 may be arranged again apart in the first direction (the X-direction) from the second data line DL2. However, the embodiment is not limited thereto. Alternatively, the first data line DL1 may be arranged on the rightmost side (the end portion) of the first fan-out portion 21, and the second data line DL2 may be arranged on the leftmost side (the start portion) of the second fan-out portion 22. In an embodiment, the first data line DL1 may be arranged on the rightmost side (the end portion) of the first fan-out portion 21, and the first data line DL1 may be arranged on the leftmost side (the start portion) of the second fan-out portion 22. However, various modifications may be made.

The plurality of first data lines DL1 and the plurality of second data lines DL2 of the first fan-out portion 21 may have different lengths from each other. In an embodiment, the length of each of the plurality of first data lines DL1 and the plurality of second data lines DL2 may be reduced from left to right of the first fan-out portion 21. In one embodiment, for example, the length of each of the plurality of first data lines DL1 and the plurality of second data lines DL2 may be reduced as being toward the first direction (the X-direction) (e.g., the central portion of the display apparatus 1). However, the embodiment is not limited thereto.

A length difference between data lines may cause a resistance difference between the data lines, and the resistance difference between the data lines may cause an RC delay difference between the pixels respectively connected to the data lines. Because the magnitude of the resistance of the data line is gradually reduced from left to right of the first fan-out portion 21, the RC delay difference between the pixels may not be perceived by a user.

The plurality of first data lines DL1 and the plurality of second data lines DL2 may be arranged to sequentially pass across the first area 1A, the bent area BA, and the second area 2A. In an embodiment, as shown in FIG. 6, the plurality of first data lines DL1 and the plurality of second data lines DL2 may be bent by at least twice. A portion in which the plurality of first data lines DL1 and the plurality of second data lines DL2 are bent may be arranged in the first area 1A and/or the second area 2A. Because stress is concentrated on the bent area BA, the portion in which the plurality of first data lines DL1 and the plurality of second data lines DL2 are bent may be arranged to avoid the bent area BA where the danger of disconnection is high.

The plurality of first data lines DL1 and the plurality of second data lines DL2 may extend in a diagonal direction crossing the first direction (the X-direction) and the second direction (the Y-direction), and extend in a direction approximately parallel to the second direction (the Y-direction) in the bent area BA. A portion of the plurality of first data lines DL1 and the plurality of second data lines DL2 arranged in the bent area BA may at least partially extend to the first area 1A and the second area 2A.

In an embodiment, the driving circuit portion 30 may be disposed or arranged in the pad area PDA. The driving circuit 30 may include various kinds of electronic elements such as an integrated circuit IC. In an embodiment, an inspection circuit portion 35 may be further disposed or arranged in the pad area PDA. The inspection circuit portion 35 may include a lighting inspection circuit and an anti-static circuit. The inspection circuit portion 35 may overlap at least a portion of the plurality of first data lines DL1 and the plurality of second data lines DL2.

Figure 7:
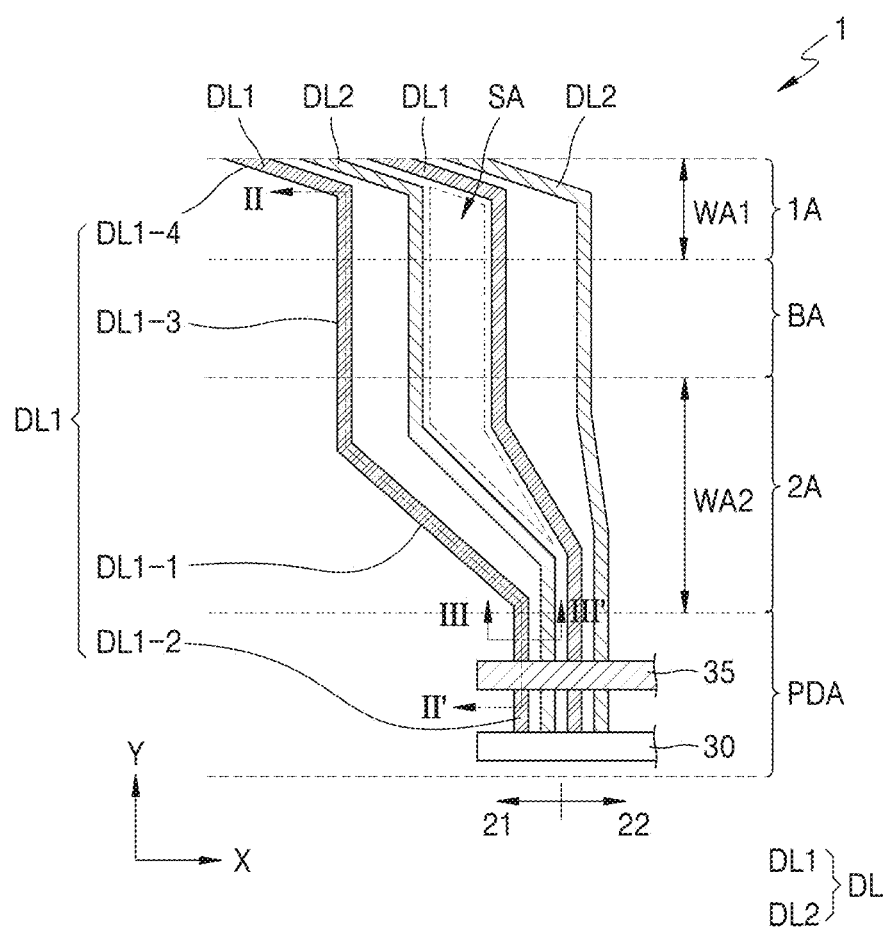
FIG. 7 is a plan view of a display apparatus according to an embodiment.
Figure 8:
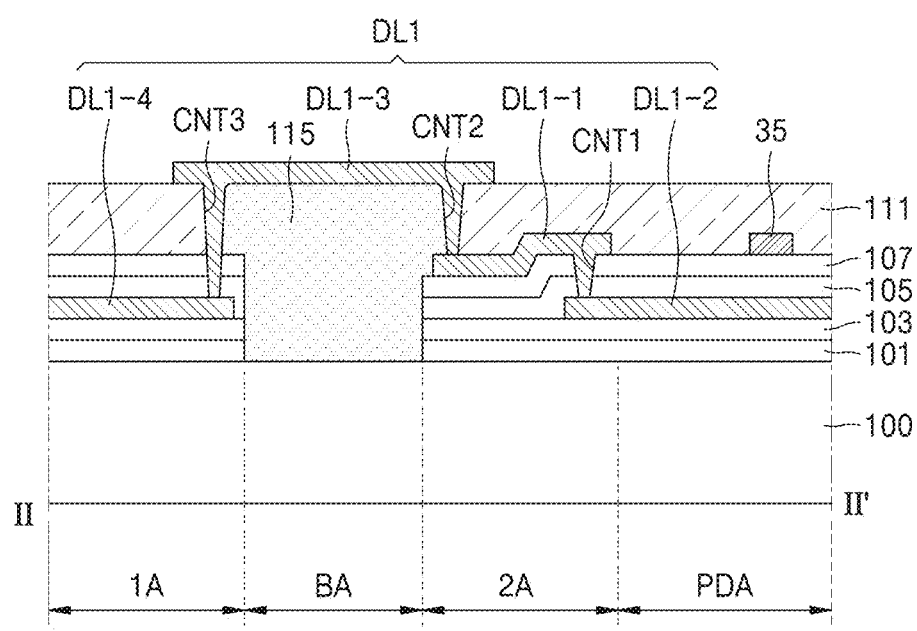
FIGS. 8 and 9 are cross-sectional views of a display apparatus according to an embodiment.
Figure 9:
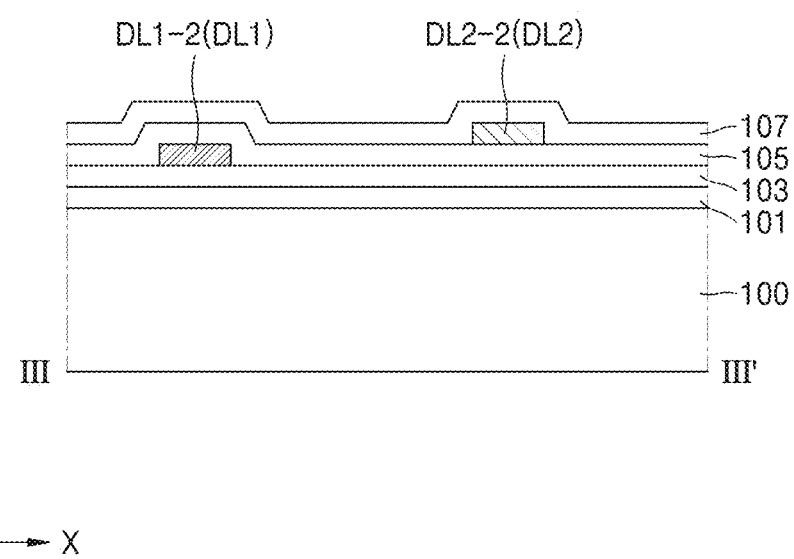

FIG. 7 is a plan view of the display apparatus 1 according to an embodiment, and FIGS. 8 and 9 are cross-sectional views of the display apparatus 1 according to an embodiment. FIG. 8 is a cross-sectional view of the display apparatus 1, taken along line II-II' of FIG. 7, and FIG. 9 is a cross-sectional view of the display apparatus 1, taken along line III-III' of FIG. 7.

FIG. 7 shows the first data line DL1 and the second data line DL2 that are adjacent to each other in the first fan-out portion 21, and the first data line DL1 and the second data line DL2 that are adjacent to each other in the second fan-out portion 22. The rest of data lines that are successively arranged in each of the first fan-out portion 21 and the second fan-out portion 22 are omitted in FIG. 7, for convenience of illustration and description. In an embodiment, the second data line DL2 arranged on the rightmost side of the first fan-out portion 21 and the first data line DL1 arranged on the leftmost side of the second fan-out portion 22 may be the data lines, that is, the second data line DL2 and the first data line DL1 that are most adjacent to each other with the separation area SA therebetween.

The separation area SA may be formed between the second data line DL2 of the first fan-out portion 21 and the first data line DL1 of the second fan-out portion 22. The separation area SA may overlap the bent area BA, and at least a portion of the separation area SA may extend to the first area 1A and the second area 2A. In an embodiment, though not shown, at least a portion of the separation area SA may extend to the pad area PDA.

Referring to FIGS. 7 to 9, in an embodiment, the buffer layer 101, the first insulating layer 103, the second insulating layer 105, the third insulating layer 107, and the first planarization layer 111 may be disposed or arranged on the substrate 100. In such an embodiment, the second planarization layer 113 (see FIG. 5) and/or additional layers may be further disposed or arranged on the first planarization layer 111, but those layers are omitted in FIGS. 8 and 9, for convenience of illustration and description.

In an embodiment, the first data line DL1 may include a first first data line DL1-1, a second first data line DL1-2, a third first data line DL1-3, and a fourth first data line DL1-4. Though not shown, the second data line DL2 may include a first second data line, a second second data line, a third second data line, and a fourth second data line.

In an embodiment, the first first data line DL1-1 and the second first data line DL1-2 may be disposed in or directly on different layers from each other. In such an embodiment, the first first data line DL1-1 and the third first data line DL1-3 may be disposed in or directly on different layers from each other.

In an embodiment, though not shown, the first second data line and the second second data line may be disposed in or directly on different layers from each other. In such an embodiment, the first second data line and the third second data line may be disposed in or directly on different layers from each other.

The first first data line DL1-1 and the first second data line may be arranged in the second area 2A, the second first data line DL1-2 and the second second data line may be arranged in the pad area PDA, the third first data line DL1-3 and the third second data line may be arranged in the bent area BA, and the fourth first data line DL1-4 and the fourth second data line may be arranged in the first area 1A.

The second first data line DL1-2 may be arranged in the pad area PDA, and at least a portion of the second first data line DL1-2 may extend to the second area 2A. In an embodiment, the second first data line DL1-2 may be disposed or arranged on the first insulating layer 103. In an embodiment, the second first data line DL1-2 may be arranged in a same layer as the gate electrode 136 (see FIG. 5) and may include a same material as that of the gate electrode 136. In an embodiment, the second first data line DL1-2 may be disposed or arranged on the second insulating layer 105. In an embodiment where the second first data line DL1-2 is arranged on the second insulating layer 105, the second first data line DL1-2 may include a same material as that of the upper electrode 146 (see FIG. 5). In an alternative embodiment, the second first data line DL1-2 may be alternately arranged on the first insulating layer 103 and the second insulating layer 105.

In an embodiment, though not shown, the second second data line may be arranged in the pad area PDA, and at least a portion of the second second data line may extend to the second area 2A. In an embodiment, the second second data line may be disposed or arranged on the second insulating layer 105. In an embodiment, the second second data line may be arranged in a same layer as the upper electrode 146 (see FIG. 5) and may include a same material as that of the upper electrode 146. In an embodiment, the second second data line may be disposed or arranged on the first insulating layer 103. In an embodiment where the second second data line is arranged on the first insulating layer 103, the second second data line may include the same material as that of the gate electrode 136 (see FIG. 5). In an alternative embodiment, the second second data line may be alternately arranged on the first insulating layer 103 and the second insulating layer 105.

The first first data line DL1-1 may be arranged in the second area 2A. In an embodiment, the first first data line DL1-1 may be disposed or arranged on the third insulating layer 107. The first first data line DL1-1 may be arranged in a same layer as the source electrode 137 (see FIG. 5) or the drain electrode 138 (see FIG. 5), which is the connection electrode, and may include a same material as that of the source electrode 137 or the drain electrode 138. The first first data line DL1-1 may be electrically connected to the second first data line DL1-2 through a contact hole (e.g., a first contact hole CNT1) defined in the second insulating layer 105 and the third insulating layer 107. In an embodiment, as shown in FIG. 8, a contact hole (e.g., the first contact hole CNT1) may be defined in the second insulating layer 105 and the third insulating layer 107, but not being limited thereto. In an embodiment where the second first data line DL1-2 is disposed or arranged on the second insulating layer 105, a contact hole (e.g., the first contact hole CNT1) may be defined in the third insulating layer 107.

In an embodiment, the contact hole (e.g., the first contact hole CNT1) that electrically connects the first first data line DL1-1 to the second first data line DL1-2 may be defined in the second area 2A. Alternatively, the contact hole (e.g., the first contact hole CNT1) that electrically connects the first first data line DL1-1 to the second first data line DL1-2 may be defined in the pad area PDA.

Alternatively, though not shown, the first second data line may be arranged in the second area 2A. In an embodiment, the first second data line may be disposed or arranged on the third insulating layer 107. The first second data line may be arranged in a same layer as the source electrode 137 (see FIG. 5) or the drain electrode 138 (see FIG. 5), which is the connection electrode, and may include a same material as that of the source electrode 137 or the drain electrode 138. The first second data line may be electrically connected to the second second data line through a contact hole defined in the second insulating layer 105 and/or the third insulating layer 107. In an embodiment, the contact hole that electrically connects the first second data line to the second second data line may be defined in the second area 2A. Alternatively, the contact hole that electrically connects the first second data line to the second second data line may be defined in the pad area PDA.

The third first data line DL1-3 may be arranged in the bent area BA. In an embodiment, an opening that exposes at least a portion of the upper surface of the substrate 100 may be defined through the buffer layer 101, the first insulating layer 103, the second insulating layer 105, and the third insulating layer 107, which are disposed or arranged on the substrate 100. In one embodiment, for example, the opening may overlap (correspond to) at least a portion of the bent area BA. In an embodiment, an opening may be defined in the first insulating layer 103, the second insulating layer 105, and the third insulating layer 107. An opening may be defined in the buffer layer 101, the first insulating layer 103, and the second insulating layer 105. However, various modifications may be made.

Alternatively, though not shown, at least a portion of the buffer layer 101, the first insulating layer 103, the second insulating layer 105, and/or the third insulating layer 107 may be arranged in the bent area BA.

An organic insulating layer 115 may be arranged inside the opening. In an embodiment, the organic insulating layer 115 may include an organic material. Because an inorganic layer is vulnerable to an organic layer, stress of the bent area BA during the bending operation may be alleviated by removing a portion of the inorganic layer (that is, the buffer layer 101, the first insulating layer 103, the second insulating layer 105, and/or the third insulating layer 107) and then filling the opening (corresponding to the removed portion of the inorganic layer) with the organic insulating layer 115 including an organic material. In an embodiment, the organic insulating layer 115 may include a same material as that of the first planarization layer 111.

The third first data line DL1-3 may be disposed or arranged on the organic insulating layer 115. The third first data line DL1-3 may be arranged in a same layer as the contact metal layer CM (see FIG. 5) and may include a same material as that of the contact metal layer CM. At least a portion of the third first data line DL1-3 may extend to the first area 1A and/or the second area 2A. The third first data line DL1-3 may be electrically connected to the first first data line DL1-1 through a contact hole (e.g. a second contact hole CNT2) defined in the first planarization layer 111. In an embodiment, the contact hole (e.g. a second contact hole CNT2) that electrically connects the third first data line DL1-3 to the first first data line DL1-1 may be defined in the second area 2A. Alternatively, though not shown, the contact hole (e.g. a second contact hole CNT2) that electrically connects the third first data line DL1-3 to the first first data line DL1-1 may be defined in the bent area BA.

Alternatively, though not shown, the third second data line may be disposed or arranged on the organic insulating layer 115. The third second data line may be arranged in a same layer as the contact metal layer CM (see FIG. 5) and may include a same material as that of the contact metal layer CM. At least a portion of the third second data line may extend to the first area 1A and/or the second area 2A. The third second data line may be electrically connected to the first second data line through a contact hole defined in the first planarization layer 111. In an embodiment, the contact hole that electrically connects the third second data line to the first second data line may be defined in the second area 2A. Alternatively, though not shown, the contact hole that electrically connects the third second data line to the first second data line may be defined in the bent area BA.

The fourth first data line DL1-4 may be arranged in the first area 1A. In an embodiment, the fourth first data line DL1-4 may be disposed or arranged on the first insulating layer 103. The fourth first data line DL1-4 may be electrically connected to the third first data line DL1-3 through a contact hole (e.g., a third contact hole CNT3) defined in the second insulating layer 105, the third insulating layer 107, and the first planarization layer 111. The fourth first data line DL1-4 may be arranged in a same layer as the gate electrode 136 (see FIG. 5) and may include a same material as that of the gate electrode 136. In an embodiment, the fourth first data line DL1-4 may be disposed or arranged on the second insulating layer 105. In this case, the fourth first data line DL1-4 may include a same material as that of the upper electrode 146 (see FIG. 5). In an alternative embodiment, the fourth first data line DL1-4 may be alternately arranged on the first insulating layer 103 and the second insulating layer 105.

In an embodiment, though not shown, the fourth second data line may be arranged in the first area 1A. In an embodiment, the fourth second data line may be disposed or arranged on the second insulating layer 105. The fourth second data line may be arranged in a same layer as the upper electrode 146 (see FIG. 5) and may include a same material as that of the upper electrode 146. In an embodiment, the fourth second data line may be disposed or arranged on the first insulating layer 103. In such an embodiment, the fourth second data line may include a same material as that of the upper electrode 146 (see FIG. 5). In an alternative embodiment, the fourth second data line may be alternately arranged on the insulating layer 103 and the second insulating layer 105.

In an embodiment, the inspection circuit portion 35 may be arranged in the pad area PDA. The inspection circuit portion 35 may be disposed or arranged on the third insulating layer 107. In an embodiment, the inspection circuit portion 35 may overlap at least a portion of the second first data line DL1-2. In an embodiment, though not shown, the inspection circuit portion 35 may overlap at least a portion of the second second data line.

In an embodiment, the first first data line DL1-1 may include a first material, and the second first data line DL1-2 may include a second material having a higher specific resistance than the first material. In such an embodiment, the first material may include aluminum (Al) and/or titanium (Ti), and the second material may include molybdenum (Mo).

In an embodiment, the first second data line may include a first material, and the second second data line may include a second material having a higher specific resistance than the first material.

In an embodiment, because the first first data line DL1-1 arranged in the second area 2A includes a material having the lower specific material, an entire resistance of the first data line DL1 may be reduced, and thus, a black brightness abnormality, an increase of crosstalk, and the occurrence of a stain defect may be effectively prevented or substantially reduced.

In an embodiment where the first first data line DL1-1 arranged in the second area 2A includes molybdenum (Mo), an entire resistance of the first data line DL1 including the first first data line DL1-1 may be increased. Accordingly, because the first first data line DL1-1 arranged in the second area 2A includes a material having a lower specific resistance than molybdenum (Mo), an entire resistance of the first data line DL1 including the first first data line DL1-1 may be reduced, and thus, black brightness abnormality, an increase of crosstalk, and the occurrence of a stain defect may be effectively prevented or substantially reduced. This is equally applicable to the second data line.

Referring to FIG. 9, in an embodiment, the second first data line DL1-2 of the first data line DL1 may be arranged in a layer different from the second second data line DL2-2 of the second data line DL2 adjacent thereto. In one embodiment, for example, the second first data line DL1-2 may be disposed or arranged on the first insulating layer 103, and the second second data line DL2-2 that is most adjacent to the second first data line DL1-2 may be disposed or arranged on the second insulating layer 105. Alternatively, though not shown, the second first data line DL1-2 may be disposed or arranged on the second insulating layer 105, and the second second data line DL2-2 that is most adjacent to the second first data line DL1-2 may be disposed or arranged on the first insulating layer 103. Alternatively, the second first data line DL1-2 of the first data line DL1 may be arranged in a same layer as the second second data line DL2-2 of the second data line DL2.

Figure 10A:
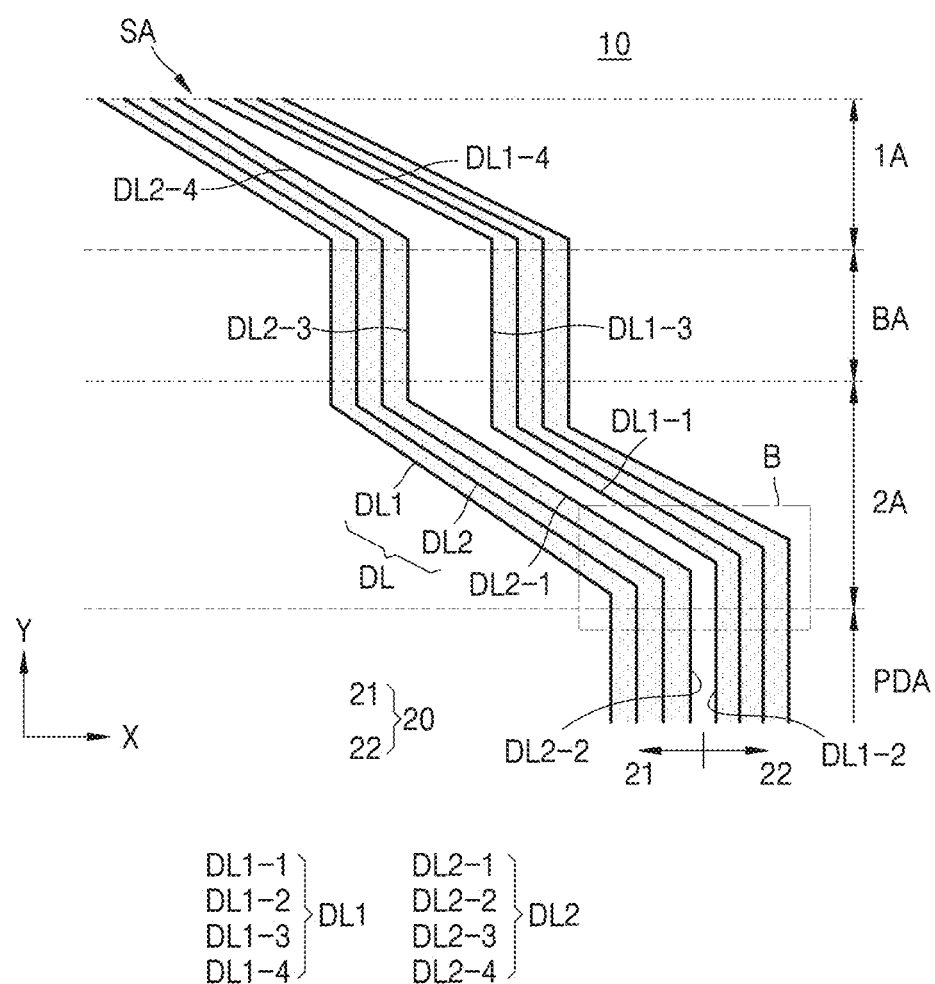
FIGS. 10A to 10D are plan views of a display apparatus according to an embodiment.
Figure 10B:
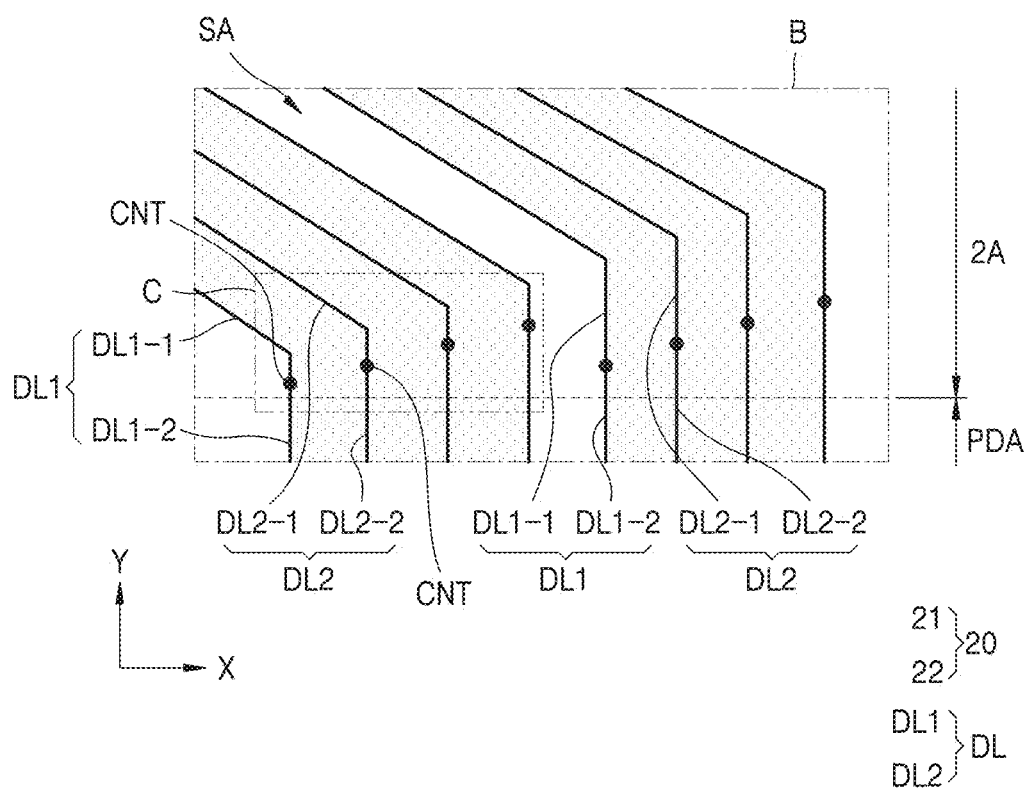
Figure 10C:
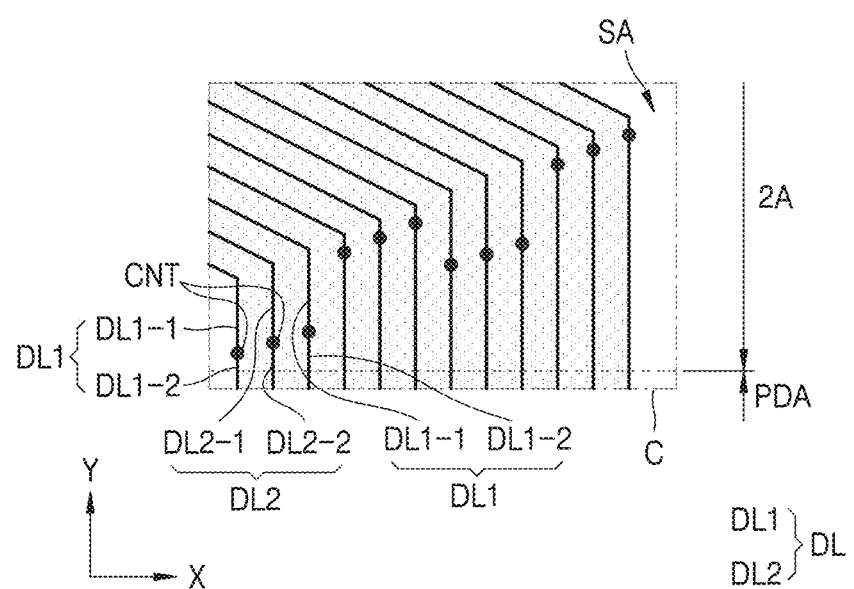
Figure 10D:
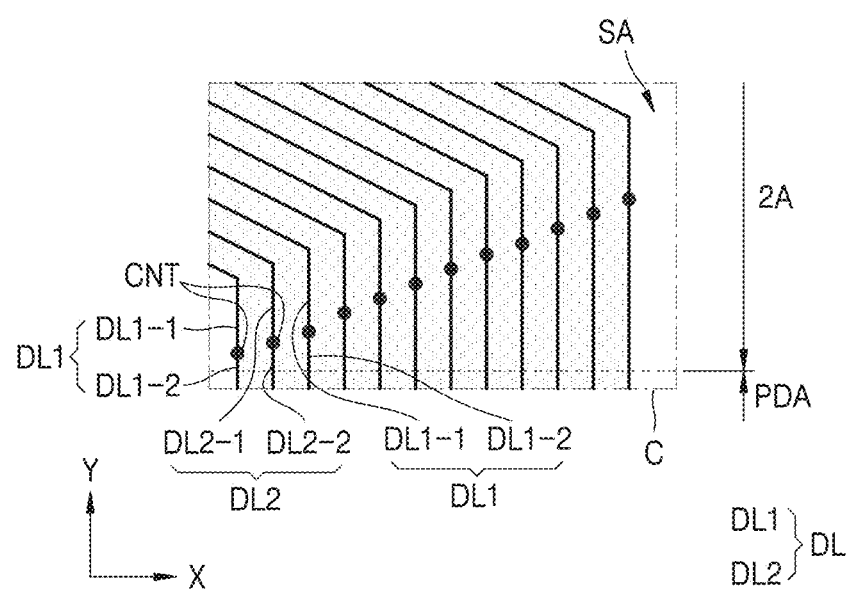

FIGS. 10A to 10D are plan views of the display apparatus 1 according to an embodiment. Specifically, FIG. 10A is a plan view of the display apparatus 1 according to an embodiment, FIG. 10B is an enlarged view of a region B of FIG. 10A, and FIGS. 10C and 10D are enlarged views of a region C of FIG. 10B.

FIG. 10A shows the data lines DL arranged in the first fan-out portion 21 and the data lines DL arranged in the second fan-out portion 22. Though it shown, for convenience of illustration description, that four data lines DL are arranged in each of the first fan-out portion 21 and the second fan-out portion 22, but the embodiment is not limited thereto.

Referring to FIG. 10A, the fan-out portion 20 may include the first fan-out portion 21 and the second fan-out portion 22, and the data lines DL may be arranged in the first fan-out portion 21 and the second fan-out portion 22. The data lines DL arranged in the first fan-out portion 21 and the second fan-out portion 22 may include at least one of the first data lines DL1 and the second data lines DL2.

In an embodiment, the separation area SA may be arranged between the first fan-out portion 21 and the second fan-out portion 22.

In an embodiment, the plurality of data lines DL may be arranged in the first area 1A, the bent area BA, the second area 2A, and the pad area PDA. As described above with reference to FIG. 8, the data lines DL arranged in the first area 1A, the bent area BA, the second area 2A, and the pad area PDA are not integrally formed as a single unitary body in a same layer but may be arranged in different layers from each other and electrically connected through contact holes.

In an embodiment, the first data line DL1 may include the first first data line DL1-1, the second first data line DL1-2, the third first data line DL1-3, and the fourth first data line DL1-4. In an embodiment, the first first data line DL1-1 may be arranged in the second area 2A, the second first data line DL1-2 may be arranged in the pad area PDA, the third first data line DL1-3 may be arranged in the bent area BA, and the fourth first data line DL1-4 may be arranged in the first area 1A.

In such an embodiment, the second data line DL2 may include a first second data line DL2-1, a second second data line DL2-2, a third second data line DL2-3, and a fourth second data line DL2-4. The first second data line DL2-1 may be arranged in the second area 2A, the second second data line DL2-2 may be arranged in the pad area PDA, the third second data line DL2-3 may be arranged in the bent area BA, and the fourth second data line DL2-4 may be arranged in the first area 1A.

In an embodiment, the first first data line DL1-1 and the first second data line DL2-1 may include a first material, and the second first data line DL1-2 and the second second data line DL2-2 may include a second material different from the first material. In such an embodiment, the third first data line DL1-3 and the third second data line DL2-3 may include the first material, and the fourth first data line DL1-4 and the fourth second data line DL2-4 may include the second material. In such an embodiment, the first first data line DL1-1, the first second data line DL2-1, the third first data line DL1-3, and the third second data line DL2-3 may include the first material. The second first data line DL1-2, the second second data line DL2-2, the fourth first data line DL1-4, and the fourth second data line DL2-4 may include the second material different from the first material. In such an embodiment, a specific resistance of the first material may be lower than a specific resistance of the second material. In an embodiment, the first material may include aluminum (Al) or titanium (Ti), and the second material may include molybdenum (Mo). However, the embodiment is not limited thereto.

In an embodiment, assuming that the entire length of the first data line DL1 is constant, in the case where the lengths of the first first data line DL1-1 and the third first data line DL1-3 including the first material increase, and the lengths of the second first data line DL1-2 and the fourth first data line DL1-4 including the second material are reduced, the entire resistance of the first data line DL1 may be reduced. In such an embodiment, assuming that the entire length of the first data line DL1 is constant, in the case where the lengths of the first first data line DL1-1 and the third first data line DL1-3 including the first material are reduced, and the lengths of the second first data line DL1-2 and the fourth first data line DL1-4 including the second material increase, the entire resistance of the first data line DL1 may increase. This is equally applicable to the second data line DL2.

Referring to FIG. 10B, the data lines DL may be arranged in the second area 2A and the pad area PDA. The data lines DL may include the first data lines DL1 and the second data lines DL2. Accordingly, the first data lines DL1 and the second data lines DL2 may be arranged in the second area 2A and the pad area PDA. In an embodiment, the first data lines DL1 and the second data lines DL2 may be alternately arranged in the first direction (the X-direction). In one embodiment, for example, the first data lines DL1, the second data lines DL2, and the first data lines DL1 may be sequentially arranged in the first direction (the X-direction). However, the embodiment is not limited thereto.

In an embodiment, the first data lines DL1 and the second data lines DL2 may be arranged in the first fan-out portion 21 and the second fan-out portion 22. In an embodiment, the first data line DL1 may be arranged on the leftmost side (the start portion) of the first fan-out portion 21, and the second data line DL2 may be arranged on the rightmost side (the end portion) of the first fan-out portion 21. In such an embodiment, the first data line DL1 may be arranged on the leftmost side (the start portion) of the second fan-out portion 22. However, the embodiment is not limited thereto.

Each first data line DL1 may include the first first data line DL1-1 and the second first data line DL1-2, and each second data line DL2 may include the first second data line DL2-1 and the second second data line DL2-2. The first first data line DL1-1 and the first second data line DL2-1 may be arranged in the second area 2A, and the second first data line DL1-2 and the second second data line DL2-2 may be arranged in the pad area PDA. At least a portion of the second first data line DL1-2 and the second second data line DL2-2 arranged in the pad area PDA may extend to the second area 2A.

In an embodiment, the first first data line DL1-1 of the first data line DL1 may be electrically connected to the second first data line DL1-2 through a contact hole CNT defined in the second area 2A. In such an embodiment, the contact hole CNT may be the first contact hole CNT1 described above with reference to FIG. 8.

In an embodiment, the first second data line DL2-1 of the second data line DL2 may be electrically connected to the second second data line DL2-2 through the contact hole CNT defined in the second area 2A.

In an embodiment, a contact hole CNT that is most adjacent in the second direction (the Y-direction) to the pad area PDA among the contact holes CNT defined in the second area 2A may be apart by about 10 micrometers (μm) or more in the second direction (the Y-direction) from the inspection circuit portion 35 arranged in the pad area PDA.

In an embodiment, because the plurality of first data lines DL1 and the plurality of second data lines DL2 may be arranged in the first fan-out portion 21, the plurality of contact holes CNT may be defined in the first fan-out portion 21. The positions of the plurality of contact holes CNT of the first fan-out portion 21 may be gradually closer to the display portion 10 (see FIG. 10A) as moving from left to right of the first fan-out portion 21. That is, the contact hole CNT in the right (the end portion) of the first fan-out portion 21 may be closer to the display portion 10 (see FIG. 10A) than the contact hole CNT in the left (the start portion) of the first fan-out portion 21. However, the embodiment is not limited thereto. Alternatively, the contact holes CNT in the first fan-out portion 21 on the right of the second fan-out portion 22 may be gradually more distant from the display portion 10 (see FIG. 10A) as moving from left to right of the first fan-out portion 21.

Referring to FIG. 10C, positions of the contact holes CNT in the first fan-out portion 21 may be repeated changed and may be gradually closer to the display portion 10 (see FIG. 2A) from left to right of the first fan-out portion 21. In one embodiment, for example, three contact holes CNT constitute one unit and repeatedly being closer or farther from the pad area PAD in the second direction (the Y-direction) and may be gradually close to the display portion 10 (see FIG. 2A) from left to right of the first fan-out portion 21 as a whole. However, the embodiment is not limited thereto. A unit of contact holes CNT repeatedly being closer or farther from the pad area PAD in the second direction (the Y-direction) may be 2 or 4. However, various modifications may be made.

In an embodiment, three contact holes CNT among the contact holes CNT in the second fan-out portion 22 may constitute one unit and be repeatedly closer or farther from the pad area PAD in the second direction (the Y-direction).

Referring to FIG. 10D, the contact holes CNT in the first fan-out portion 21 may be gradually closer to the display portion 10 (see FIG. 2A) from left to right of the first fan-out portion 21.

In an embodiment, because the plurality of first data lines DL1 and the plurality of second data lines DL2 may be arranged in the second fan-out portion 22, the plurality of contact holes CNT may be defined in the second fan-out portion 22. The positions of the plurality of contact holes CNT of the second fan-out portion 22 may be gradually closer to the display portion 10 (see FIG. 10A) from left to right of the second fan-out portion 22. However, when viewed as a whole, the positions of the plurality of contact holes CNT of the second fan-out portion 22 may be gradually close to and away again from the display portion 10 (see FIG. 10A) from left to right of the second fan-out portion 22.

The plurality of data lines DL arranged in the first fan-out portion 21 may have different lengths from each other. Accordingly, the resistances of the plurality of data lines DL arranged in the first fan-out portion 21 may be different from each other. In one embodiment, for example, when the length of the data line DL is long, the entire resistance of the data line DL may increase. When the length of the data line DL is short, the entire resistance of the data line DL may be reduced.

in an embodiment, the plurality of first data lines DL1 and the plurality of second data lines DL2 arranged in the first fan-out portion 21 may be formed in different lengths. Accordingly, the resistances of the plurality of first data lines DL1 and the plurality of second data lines DL2 arranged in the first fan-out portion 21 may be different from each other. In one embodiment, for example, when the length of the data lines, that is, the first data lines DL1 and the second data lines DL2 are long, the entire resistance of the first data lines DL1 and the second data lines DL2 may increase. In contrast, when the length of the data lines, that is, the first data lines DL1 and the second data lines DL2 are short, the entire resistance of the first data lines DL1 and the second data lines DL2 may be reduced.

In an embodiment, where the plurality of data lines DL arranged in the first fan-out portion 21 have different lengths, the plurality of data lines DL may have different resistances from each other. Due to differences in the resistances of the plurality of data lines DL, black brightness abnormality, an increase of crosstalk, and a stain defect may occur.

Assuming that the entire lengths of the data lines, that is, the first data line DL1 and the second data line DL2 are constant, when the length of a portion including a material of a small specific resistance increases and the length of a portion including a material of a large specific resistance is reduced, the entire resistance of the first data line DL1 and the second data line DL2 may be reduced.

In an embodiment, the entire resistance of the first data line DL1 and the second data line DL2 may be adjusted by adjusting the positions of the contact hole of the second area 2A. In one embodiment, for example, the entire resistance of the first data line DL1 and the second data line DL2 may be reduced by increasing the lengths of the first first data line DL1-1 and the first second data line DL2-1 including the first material, and reducing the lengths of the second first data line DL1-2 and the second second data line DL2-2 including the second material having a specific resistance larger than that of the first material. In such an embodiment, the entire resistance of the first data line DL1 and the second data line DL2 may increase.

Accordingly, a resistance difference (deviation) between the first data line DL1 and the second data line DL2 may be reduced, and thus, visibility of the display apparatus may be improved.

In an embodiment, as described above, because the fourth first data line DL1-4 and the fourth second data line DL2-4 include a material having a large specific resistance, in the case where the lengths of the fourth first data line DL1-4 and the fourth second data line DL2-4 increase, the resistances of the first data line DL1 and the second data line DL2 may increase.

Alternatively, in the case where a length difference between the fourth first data line DL1-4 and the fourth second data line DL2-4 occurs, there may be a resistance difference (deviation) between the fourth first data line DL1-4 and the fourth second data line DL2-4.

Referring to FIGS. 10A and 10B, there may be a resistance difference between the first data line DL1 and the second data line DL2 arranged in the first fan-out portion 21 and the second fan-out portion 22. When the data line (e.g., the second data line DL2) on the rightmost side of the first fan-out portion 21 is compared with the data line (e.g., the first data line DL1) on the leftmost side of the second fan-out portion 22, due to a length difference between the fourth first data line DL1-4 and the fourth second data line DL2-4, there may be a resistance difference (deviation) between the data line (e.g., the second data line DL2) on the rightmost side of the first fan-out portion 21 and the data line (e.g., the first data line DL1) on the leftmost side of the second fan-out portion 22. In one embodiment, for example, because the length of the fourth first data line DL1-4 on the leftmost side of the second fan-out portion 22 may be greater than the length of the fourth second data line DL2-4 on the rightmost side of the first fan-out portion 21, the resistance of the data line (e.g., the first data line DL1) on the leftmost side of the second fan-out portion 22 may be greater than the resistance of the data line (e.g., the second data line DL2) on the rightmost side of the first fan-out portion 21. Due to a resistance difference between the first data line DL1 and the second data line DL2 that are most adjacent to each other with the separation area SA therebetween, black brightness abnormality, an increase of crosstalk, and a stain defect may occur.

In an embodiment, in the case where the position of the contact hole CNT that electrically connects the first first data line DL1-1 to the second first data line DL1-2 is close to the display portion 10 in the second direction (the Y-direction), the length of the first first data line DL1-1 may be reduced, and the length of the second first data line DL1-2 may increase. On the contrary, in the case where the position of the contact hole CNT is away in the second direction (the Y-direction) from the display portion 10, the length of the first first data line DL1-1 may increase, and the length of the second first data line DL1-2 may be reduced.

In an embodiment, in the case where the length of the first first data line DL1-1 increases, and the length of the second first data line DL1-2 is reduced, the entire resistance of the data line (e.g., the first data line DL1) may be reduced. In the case where the length of the first first data line DL1-1 is reduced, and the length of the second first data line DL1-2 increases, the entire resistance of the data line (e.g., the second data line DL2) may increase.

Accordingly, when the position of the contact hole CNT that electrically connects the first first data line DL1-1 to the second first data line DL1-2 is close to the display portion 10 in the second direction (the Y-direction), the length of the first first data line DL1-1 is reduced and the length of the second first data line DL1-2 increases, and thus, the entire resistance of the data line (e.g., the first data line DL1) may increase. In addition, when the position of the contact hole CNT is away in the second direction (the Y-direction) from the display portion 10, the length of the first first data line DL1-1 increases and the length of the second first data line DL1-2 is reduced, and thus, the entire resistance of the data line (e.g., the first data line DL1) may be reduced. This is equally applicable to the second data line DL2.

In an embodiment, the contact hole CNT on the rightmost side of the first fan-out portion 21 is arranged closer to the display portion 10 than the contact hole CNT on the leftmost side of the second fan-out portion 22, such that the entire resistance of the data line (e.g., the second data line DL2) on the rightmost side of the first fan-out portion 21 may be increased, and the entire resistance of the data line (e.g., the first data line DL1) on the leftmost side of the second fan-out portion 22 may be reduced. Accordingly, a resistance difference (deviation) between the data line (e.g., the second data line DL2) on the rightmost side of the first fan-out portion 21 and the data line (e.g., the first data line DL1) on the leftmost side of the second fan-out portion 22 may be reduced. In such an embodiment, because a resistance difference (deviation) between the data line (e.g., the second data line DL2) on the rightmost side of the first fan-out portion 21 and the data line (e.g., the first data line DL1) on the leftmost side of the second fan-out portion 22 is reduced, black brightness abnormality, an increase of crosstalk, and the occurrence of a stain defect may be effectively prevented or substantially reduced.

Figure 11:
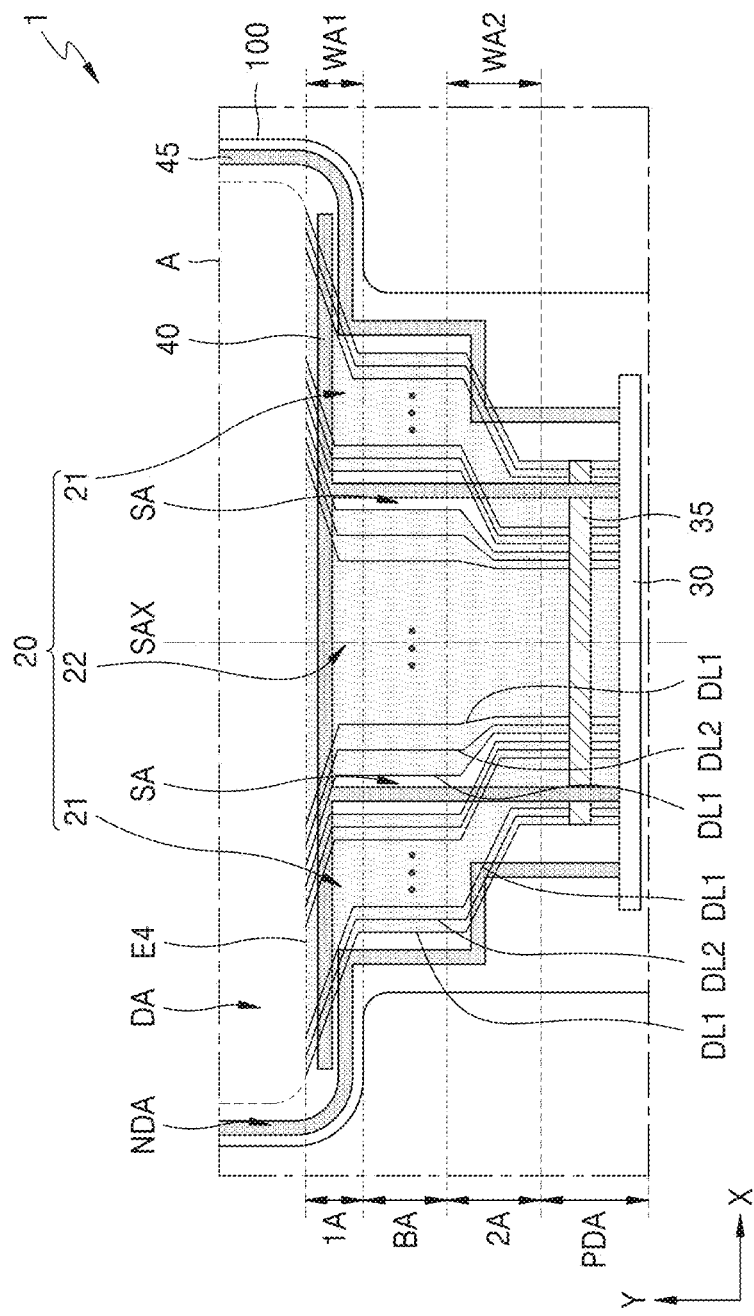
FIG. 11 is a plan view of a display apparatus according to an embodiment.
Figure 12:
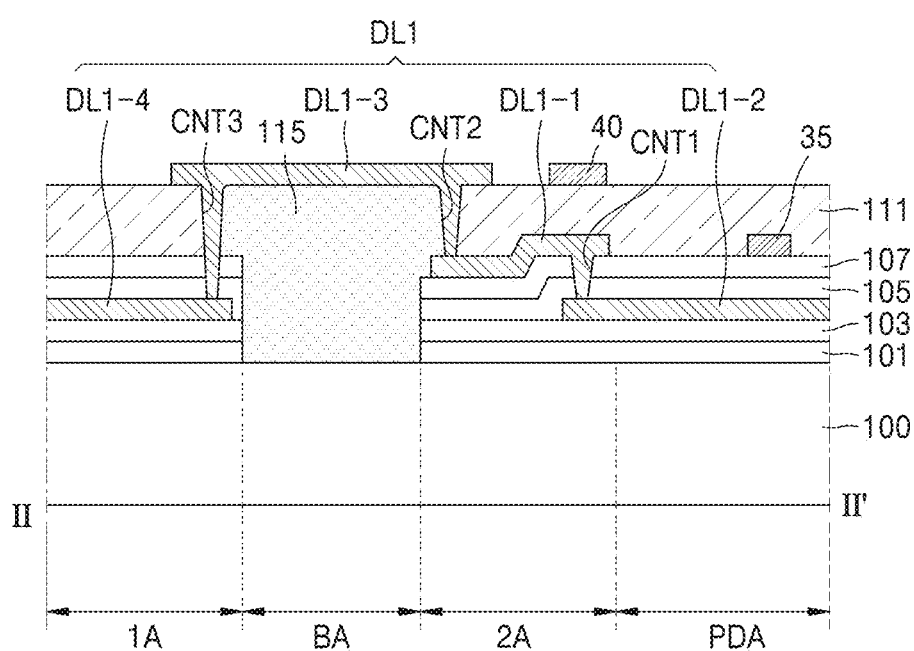
FIG. 12 is a cross-sectional view of a display apparatus according to an embodiment.

FIG. 11 is a plan view of the display apparatus according to an embodiment, and FIG. 12 is a cross-sectional view of the display apparatus according to an embodiment. The embodiment of FIGS. 11 and 12 is substantially the same as the embodiment of FIGS. 6 and 8 except that a driving power supply line 40 and a common power supply line 45 are further arranged on the first planarization layer 111. In FIGS. 11 and 12, the same or like reference numerals as those of FIGS. 6 and 8 denote the same or like elements, and thus, any repetitive detailed descriptions thereof will be omitted.

Referring to FIGS. 11 and 12, in an embodiment, the driving power supply line 40 and the common power supply line 45 may be arranged in the non-display area NDA.

At least a portion of the driving power supply line 40 may be arranged in the separation area SA. That is, at least a portion of the driving power supply line 40 may be arranged in the separation area SA, that is, between the first fan-out portion 21 and the second fan-out portion 22.

At least a portion of the common power supply line 45 may be arranged outside the fan-out portion 20. Though not shown, the common power supply line 45 may surround a portion of the display area DA by having a loop shape with one open side.

The driving power supply line 40 and the common power supply line 45 may be arranged over the first area 1A, the bent area BA, the second area 2A, and the pad area PDA. In one embodiment, for example, the driving power supply line 40 and the common power supply line 45 may overlap at least a portion of the first area 1A, the bent area BA, the second area 2A, and the pad area PDA.

In an embodiment, the driving power supply line 40 and the common power supply line 45 may overlap at least a portion of the data line (e.g., the first data line DL1 and/or the second data line DL2). In an embodiment, the driving power supply line 40 and the common power supply line 45 may be disposed or arranged on the first planarization layer 111. The driving power supply line 40 and the common power supply line 45 may be arranged in a same layer as the third first data line DL1-3 and may include a same material as that of the third first data line DL1-3.

Figure 13:
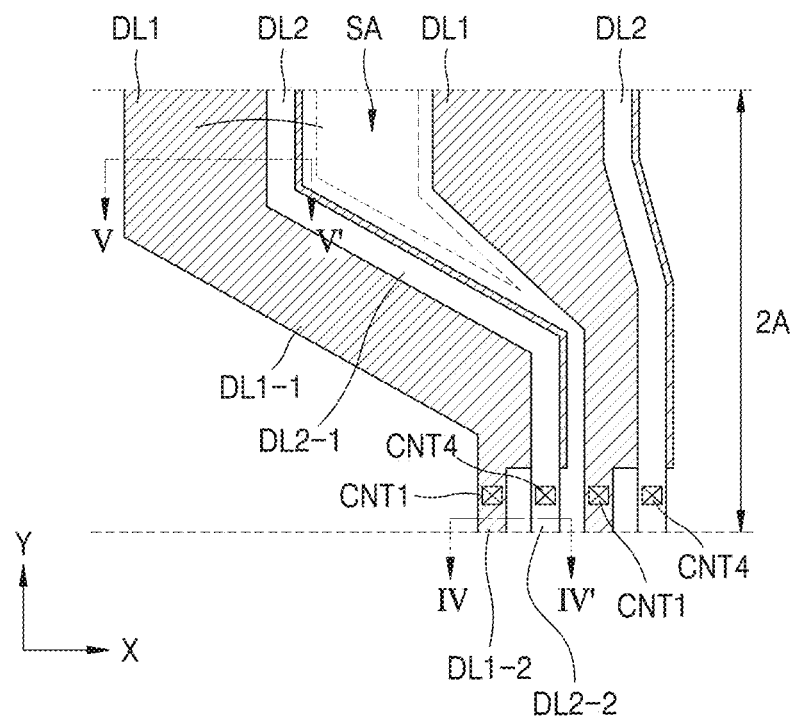
FIG. 13 is a plan view of a display apparatus according to an embodiment.
Figure 14:
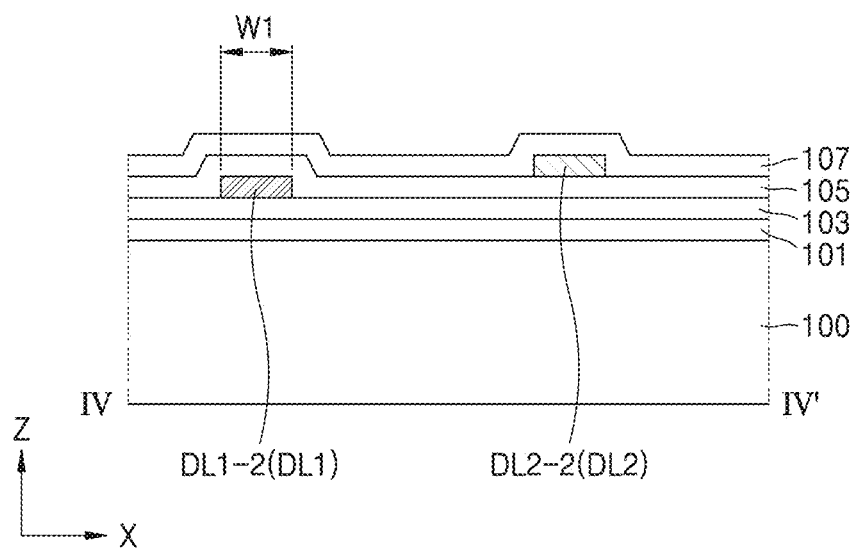
FIGS. 14 and 15 are cross-sectional views of a display apparatus according to an embodiment.
Figure 15:
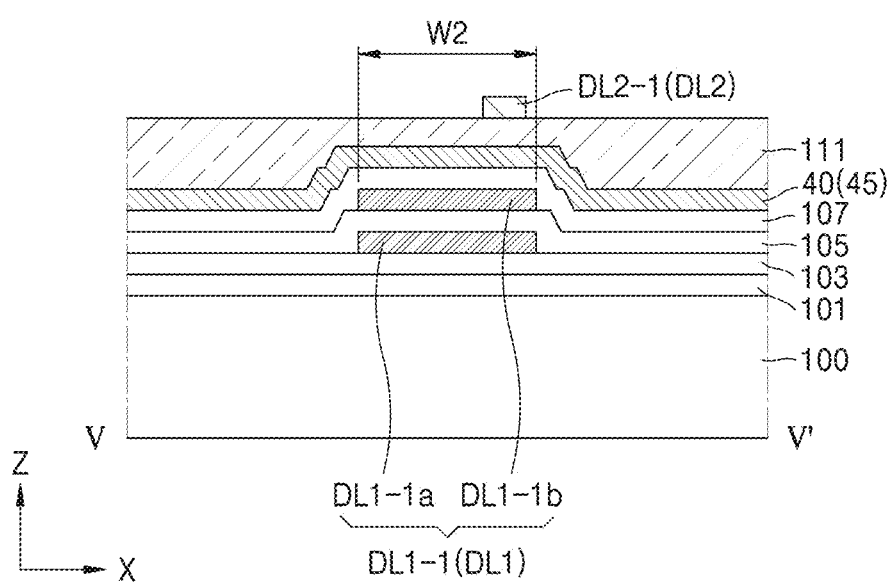

FIG. 13 is a plan view of the display apparatus according to an embodiment, and FIGS. 14 and 15 are cross-sectional views of the display apparatus according to an embodiment. FIG. 14 is a cross-sectional view of the display apparatus, taken along line IV-IV' of FIG. 13, and FIG. 15 is a cross-sectional view of the display apparatus, taken along line V-V of FIG. 13. The embodiment of FIGS. 13 to 15 is substantially the same as the embodiment of FIGS. 7 to 9 except that the first first data line DL1-1 includes a first portion DL1-1a and a second portion DL1-1b, and the first first data line DL1-1 overlaps at least a portion of the first second data line DL2-1. In FIGS. 13 to 15, the same or like reference numerals as those of FIGS. 7 to 9 denote the same or like elements, and thus, any repetitive detailed descriptions thereof will be omitted.

FIG. 13 shows the first data line DL1 and the second data line DL2 arranged adjacent to each other in the first fan-out portion 21, and the first data line DL1 and the second data line DL2 arranged in the second fan-out portion 22, and the rest of the data lines successively arranged in the first fan-out portion 21 and the second fan-out portion 22 are omitted, for convenience of illustration and description. The separation area SA may be formed between the second data line DL2 of the first fan-out portion 21 and the first data line DL1 of the second fan-out portion 22 that are arranged adjacent to each other.

Referring to FIGS. 13 and 14, the first data line DL1 may include the first first data line DL1-1 and the second first data line DL1-2, and the second data line DL2 may include the first second data line DL2-1 and the second second data line DL2-2.

In an embodiment, the first first data line DL1-1 of the first data line DL1 may be electrically connected to the second first data line DL1-2 through a contact hole (e.g., the first contact hole CNT1) defined in the second area 2A. In an embodiment, the first second data line DL2-1 of the second data line DL2 may be electrically connected to the second second data line DL2-2 through a contact hole (e.g., the fourth contact hole CNT4) defined in the second area 2A. The fourth contact hole CNT4 shown in FIG. 13 may denote the same contact hole as the contact hole CNT described above with reference to FIGS. 10A to 10D.

In an embodiment, the second first data line DL1-2 may be disposed or arranged on the first insulating layer 103, and the second second data line DL2-2 may be disposed or arranged on the second insulating layer 105. Though not shown, the second first data line DL1-2 may be disposed or arranged on the second insulating layer 105, and the second second data line DL2-2 may be disposed or arranged on the first insulating layer 103. In such an embodiment, the second first data line DL1-2 may be arranged in a same layer as the second second data line DL2-2.

In an embodiment, the second first data line DL1-2 arranged on the first insulating layer 103 may have a first width W1.

Referring to FIG. 15, in an embodiment, the first first data line DL1-1 may include the first portion DL1-1a and the second portion DL1-1b that are arranged in different layers from each other. In such an embodiment, the first first data line DL1-1 may include the first portion DL1-1a on the first insulating layer 103, and the second portion DL1-1b on the second insulating layer 105. The first portion DL1-1a of the first first data line DL1-1 may overlap at least a portion of the second portion DL1-1b.

In an embodiment, the first portion DL1-1a and the second portion DL1-1b of the first first data line DL1-1 may be two divided portions of one second first data line DL1-2. In one embodiment, for example, the first portion DL1-1a of the first first data line DL1-1 may be an extended portion of the second first data line DL1-2, and the second portion DL1-1b of the first first data line DL1-1 may be a layer electrically connected to the second first data line DL1-2 through a contact hole (e.g., the first contact hole CNT1).

Accordingly, a same signal may be applied to the first portion DL1-1a and the second portion DL1-1b of the first first data line DL1-1.

In an embodiment, the first second data line DL2-1 may be disposed or arranged on the first planarization layer 111. The first second data line DL2-1 may be arranged in a same layer as the contact metal layer CM (see FIG. 5) and may include a same material as that of the contact metal layer CM. In an embodiment, the first second data line DL2-1 may overlap at least a portion of the first portion DL1-1a and/or the second portion DL1-1b of the first first data line DL1-1.

When different signals are applied to the first second data line DL2-1 and the first first data line DL1-1 that overlap each other, a corresponding coupling may occur, and thus, a brightness deviation may occur.

In an embodiment, shields layers 40 and 45 may be arranged between the first second data line DL2-1 and the first first data line DL1-1. The shields layers 40 and 45 may be disposed or arranged on the third insulating layer 107. The shields layers 40 and 45 may be arranged in a same layer as the source electrode 137 (see FIG. 5), which is the connection electrode, and may include a same material as that of the source electrode 137. In an embodiment, the shields layers 40 and 45 may include at least one selected from the driving power supply line 40 and the common power supply line 45.

In such an embodiment where the shields layers 40 and 45 are arranged between the first second data line DL2-1 and the first first data line DL1-1, the occurrence of a brightness deviation due to coupling may be effectively prevented or substantially reduced.

The second first data line DL1-2 and the second second data line DL2-2 may be arranged in different layers from each other. In one embodiment, for example, the second first data line DL1-2 may be disposed or arranged on the first insulating layer 103, and the second second data line DL2-2 may be disposed or arranged on the second insulating layer 105.

The second second data line DL2-2 on the second insulating layer 105 may be electrically connected to the first second data line DL2-1 arranged on the first planarization layer 111 through a contact hole (e.g., the fourth contact hole CNT4). Because the second second data line DL2-2 is electrically connected to the first second data line DL2-1 arranged on the first planarization layer 111 through the contact hole (e.g., the fourth contact hole CNT4), the second portion DL1-1b of the first first data line DL1-1 may be disposed or arranged on the second insulating layer 105 under the first second data line DL2-1.

At least a portion of the second first data line DL1-2 arranged on the first insulating layer 103 may extend to the second area 2A to form the first portion DL1-1a of the first first data line DL1-1. In such an embodiment, at least a portion of the second first data line DL1-2 arranged on the first insulating layer 103 may be electrically connected to the second portion DL1-1b of the first first data line DL1-1 arranged on the second insulating layer 105 through a contact hole (e.g., the first contact hole CNT1).

Accordingly, because the first portion DL1-1a and the second portion DL1-1b of the first first data line DL1-1 are formed through one second first data line DL1-2, a same signal may be applied to the first portion DL1-1a and the second portion DL1-1b of the first first data line DL1-1. Because the same signal is applied to the first portion DL1-1a and the second portion DL1-1b of the first first data line DL1-1, even when the first portion DL1-1a overlaps the second portion DL1-1b, a brightness deviation (difference) due to coupling may not occur.

In an embodiment, the first portion DL1-1a and the second portion DL1-1b of the first first data line DL1-1 may have a second width W2 different from a first width W1 of the second first data line DL1-2. In an embodiment, the second width W2 may be greater than the first width W1. Accordingly, the first portion DL1-1a and the second portion DL1-1b of the first first data line DL1-1 may have a width greater than the width of the second first data line DL1-2. Because the widths of the first portion DL1-1a and the second portion DL1-1b of the first first data line DL1-1 increase, the entire resistance of the data line may be reduced.

In an embodiment, as shown in FIGS. 13 to 15 that the first first data line DL1-1 of the first data line DL1 may be divided into two portions and the widths of the two divided portions increase, but the embodiment is not limited thereto. Alternatively, though not shown, the first second data line DL2-1 of the second data line DL2 may be divided into two portions, and the two divided portions may be wider than one not divided.

Figure 16:
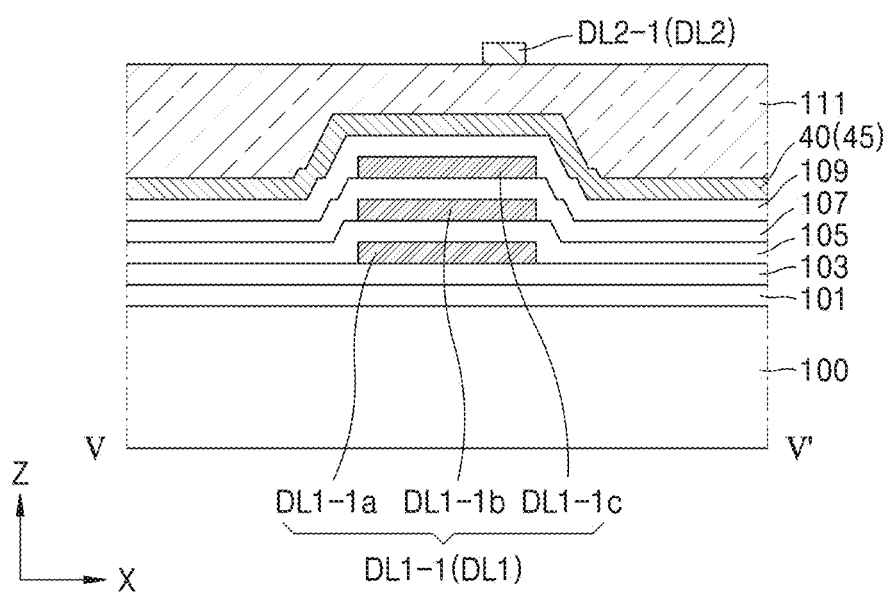
FIG. 16 is a cross-sectional view of a display apparatus according to an embodiment.

FIG. 16 is a cross-sectional view of the display apparatus according to an embodiment. The embodiment of FIG. 16 is substantially the same as the embodiment of FIG. 15 except that a fourth insulating layer 109 is further provided and a third portion DL1-1c is further provided to the first first data line DL1-1. In FIG. 16, the same or like reference numerals as those of FIG. 15 denote the same or like elements, and thus, any repetitive detailed descriptions thereof will be omitted.

Referring to FIG. 16, the fourth insulating layer 109 may be disposed or arranged on the third insulating layer 107. The first first data line DL1-1 may include the first portion DL1-1a, the second portion DL1-1b, and the third portion DL1-1c. The first portion DL1-1a, the second portion DL1-1b, and the third portion DL1-1c may partially overlap one another. In such an embodiment, the same signal may be applied to the first portion DL1-1a, the second portion DL1-1b, and the third portion DL1-1c.

The first second data line DL2-1 may be disposed or arranged on the first planarization layer 111. The first second data line DL2-1 may overlap at least a portion of the first portion DL1-1a, the second portion DL1-1b, and the third portion DL1-1c of the first first data line DL1-1.

The shield layers 40 and 45 may be arranged between the first second data line DL2-1 and the first first data line DL1-1. The shield layers 40 and 45 may be disposed or arranged on the fourth insulating layer 109. In an embodiment, the shield layers 40 and 45 may include at least one selected from the driving power supply line 40 and the common power supply line 45.

Because the first first data line DL1-1 includes the first portion DL1-1a, the second portion DL1-1b, and the third portion DL1-1c that overlap one another, the resistance of the data line (e.g., the first data line DL1) may be further reduced.

In an embodiment, the data line (e.g., the first data line DL1) may include the first first data line DL1-1 in the second area 2A, the second first data line DL1-2 in the pad area PDA, the third first data line DL1-3 in the bent area BA, and the fourth first data I line DL1-4 in the first area 1A.

In an embodiment, because the first first data line DL1-1 arranged in the second area 2A includes a material having a small specific resistance, the entire resistance of the data line (e.g., the first data line DL1) may be reduced, and the display apparatus 1 that may be driven at high speeds of about 120 hertz (Hz) or more may be provided. Because the display apparatus 1 may be driven at high speeds of about 120 Hz or more, the resolution of the display apparatus 1 may be increased, and simultaneously, the quality of the display apparatus 1 may be improved. In such an embodiment, because the entire resistance of the data line (e.g., the first data line DL1) may be reduced and on-time of a scan signal may be secured, black brightness abnormality, an increase of crosstalk, and the occurrence of a stain defect may be effectively prevented or substantially reduced.

In an embodiment, the occurrence of a resistance difference due to a length difference between different blocks (e.g., between the first fan-out portion 21 and the second fan-out portion 22) may be effectively prevented or substantially reduced by adjusting the position of the contact hole CNT that electrically connects the first first data line DL1-1 in the second area 2A to the second first data line DL1-2 in the pad area PDA.

According to an embodiment, the display apparatus with reduced non-display area and having improved light-emission uniformity between pixels adjacent to each other may be implemented. However, the scope of the present disclosure is not limited by this effect.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display apparatus comprising:
   a substrate including a display area and a non-display area, wherein the non-display area includes a first area, a second area, a bent area and a pad area, and the bent area is arranged between the first area and the second area;
   a display portion arranged in the display area;
   a driving circuit portion arranged in the non-display area; and
   a fan-out portion arranged between the display portion and the driving circuit portion and in the first area, the bent area and the second area, wherein the fan-out portion transfers a data signal from the driving circuit portion to the display portion,
   wherein the fan-out portion includes a first data line including a first first data line and a second first data line, wherein the first first data line is arranged in the second area, and the second first data line is arranged in the pad area and disposed in a layer different from the first first data line.

2. The display apparatus of claim 1, wherein
   the first data line further includes a third first data line arranged in the bent area, and
   the third first data line is disposed in a layer different from the second first data line.

3. The display apparatus of claim 1, wherein the first first data line and the second first data line include different materials from each other.

4. The display apparatus of claim 1, wherein
   the fan-out portion further includes a second data line including a first second data line and a second second data line, the first second data line being arranged in the second area, wherein the second second data line is arranged in the pad area and disposed in a layer different from the first second data line.

5. The display apparatus of claim 4, wherein the first first data line is disposed in a same layer as the first second data line.

6. The display apparatus of claim 4, wherein the second first data line and the second second data line are disposed in different layers from each other.

7. The display apparatus of claim 4, wherein the fan-out portion further includes a first fan-out portion, a second fan-out portion, and a separation area between the first fan-out portion and the second fan-out portion.

8. The display apparatus of claim 7, wherein the first first data line is electrically connected to the second first data line through a first contact hole defined in the second area.

9. The display apparatus of claim 8, wherein a position of the first contact hole inside the first fan-out portion is gradually being toward or away from the display portion.

10. The display apparatus of claim 9, wherein the first second data line is electrically connected to the second second data line through a second contact hole defined in the second area.

11. The display apparatus of claim 10, wherein, in the second data line and the first data line arranged closest to each other with the separation area therebetween, the second contact hole is closer to the display portion than the first contact hole, wherein the first second data line of the second data line is electrically connected to the second second data line through the second contact hole, and the first first data line of the first data line is electrically connected to the second first data line through the first contact hole.

12. The display apparatus of claim 1, wherein the display apparatus is foldable around a folding axis.

13. A display apparatus foldable around a folding axis, the display apparatus comprising:
    a substrate including a display area and a non-display area, wherein the non-display area includes a first area, a second area, a bent area and a pad area, and the bent area is arranged between the first area and the second area;
    a display portion arranged in the display area;
    a driving circuit portion arranged in the non-display area; and
    a fan-out portion arranged between the display portion and the driving circuit portion and in the first area, the bent area and the second area, wherein the fan-out portion transfers a data signal from the driving circuit portion to the display portion,
    wherein the fan-out portion includes a first data line including a first first data line and a second first data line, which are disposed in different layers from each other.

14. The display apparatus of claim 13, wherein
the first first data line is arranged in the second area, and the second first data line is arranged in the pad area.

* * * * *